United States Patent
Ahn et al.

(10) Patent No.: US 7,067,421 B2
(45) Date of Patent: Jun. 27, 2006

(54) MULTILEVEL COPPER INTERCONNECT WITH DOUBLE PASSIVATION

(75) Inventors: Kie Y. Ahn, Chappaqua, NY (US); Leonard Forbes, Corvallis, OR (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 10/721,920

(22) Filed: Nov. 24, 2003

(65) Prior Publication Data

US 2005/0112871 A1 May 26, 2005

Related U.S. Application Data

(62) Division of application No. 09/584,157, filed on May 31, 2000, now Pat. No. 6,674,167.

(51) Int. Cl.
*H01L 21/4763* (2006.01)

(52) U.S. Cl. .................. 438/649; 438/619; 438/623; 438/624; 438/653; 438/655

(58) Field of Classification Search ............. 438/649, 438/655, 653, 652, 624, 623, 619
See application file for complete search history.

(56) References Cited

U.S. PATENT DOCUMENTS

| | | | |
|---|---|---|---|
| 1,254,987 A | 1/1918 | Cooper | |
| 1,976,375 A | 10/1934 | Smith | 148/11.5 |
| 2,244,608 A | 6/1941 | Cooper | 75/138 |
| 2,842,438 A | 7/1958 | Saarivirta et al. | 75/153 |
| 3,147,110 A | 9/1964 | Foerster | 75/122.5 |
| 3,337,334 A | 8/1967 | Fenn | 75/150 |
| 3,506,438 A | 4/1970 | Krock | 75/208 |
| 3,548,915 A | 12/1970 | Richmond et al. | 164/68 |
| 3,548,948 A | 12/1970 | Richmond et al. | 164/68 |
| 3,687,737 A | 8/1972 | Krock et al. | 148/2 |
| 3,832,456 A | 8/1974 | Kobetz et al. | 423/645 |
| 3,923,500 A | 12/1975 | Kitazawa et al. | 75/156.5 |

(Continued)

FOREIGN PATENT DOCUMENTS

| | | | |
|---|---|---|---|
| JP | 05267643 | 10/1993 | 29/46 |
| JP | 07078815 | 3/1995 | |
| JP | 07-321111 | 8/1995 | |

OTHER PUBLICATIONS

American Society for Metals, "Phase Diagrams", *Metals Handbook*, 10th Ed., vol. 3, Metals Park, Ohio,(1992).

(Continued)

*Primary Examiner*—Michael Trinh
(74) *Attorney, Agent, or Firm*—Schwegman, Lundberg, Woessner & Kluth, P.A.

(57) ABSTRACT

Structures and methods provide multilevel wiring interconnects in an integrated circuit assembly which alleviate problems associated with integrated circuit size and performance and include methods for forming multilevel wiring interconnects in an integrated circuit assembly, e.g., forming multilayer metal lines separated by a number of air gaps above a substrate. A silicide layer is formed on the multilayer metal lines, then oxidized. An insulator is deposited to fill interstices created by air gaps between the multilayer metal lines. In one embodiment, forming multilayer metal lines includes a conductor bridge level. In one embodiment, forming a silicide layer on the multilayer metal lines includes using a pyrolysis of silane at a temperature of between 300–500 degrees Celsius. In one embodiment, a metal layer is formed on the oxided silicide layer. The metal layer includes one of Aluminum, Chromium, Titanium, Zirconium and Aluminum oxide.

72 Claims, 4 Drawing Sheets

U.S. PATENT DOCUMENTS

| | | |
|---|---|---|
| 3,954,570 A | 5/1976 | Shirk et al. .................... 204/15 |
| 4,022,931 A | 5/1977 | Black et al. .................... 427/91 |
| 4,029,377 A | 6/1977 | Guglielmi ..................... 339/19 |
| 4,065,330 A | 12/1977 | Masumoto et al. ......... 148/31.55 |
| 4,101,855 A | 7/1978 | Drapeau ..................... 335/106 |
| 4,158,719 A | 6/1979 | Frantz ......................... 428/567 |
| 4,233,066 A | 11/1980 | Sundin et al. .................. 75/142 |
| 4,314,594 A | 2/1982 | Pfeifer et al. ................ 148/108 |
| 4,386,116 A | 5/1983 | Nair et al. ..................... 427/99 |
| 4,389,429 A | 6/1983 | Soclof ........................ 438/492 |
| 4,394,223 A | 7/1983 | Hall ............................. 204/15 |
| 4,423,547 A | 1/1984 | Farrar et al. .................... 29/571 |
| 4,561,173 A | 12/1985 | Te Velde .................... 438/619 |
| 4,565,157 A | 1/1986 | Brors et al. ................. 118/719 |
| 4,574,095 A | 3/1986 | Baum et al. ................ 427/53.1 |
| 4,709,359 A | 11/1987 | Loftin ......................... 367/155 |
| 4,762,728 A | 8/1988 | Keyser et al. ................. 427/38 |
| 4,788,082 A | 11/1988 | Schmitt .................... 427/248.1 |
| 4,847,111 A | 7/1989 | Chow et al. .................. 427/38 |
| 4,931,410 A | 6/1990 | Tokunaga et al. ........... 437/189 |
| 4,933,743 A | 6/1990 | Thomas et al. |
| 4,948,459 A | 8/1990 | Van Laarhoven et al. .. 156/643 |
| 4,962,058 A | 10/1990 | Cronin et al. ............... 437/187 |
| 4,996,584 A | 2/1991 | Young et al. ................. 357/71 |
| 5,000,818 A * | 3/1991 | Thomas et al. ............. 438/619 |
| 5,019,531 A | 5/1991 | Awaya et al. ............... 437/180 |
| 5,034,799 A | 7/1991 | Tomita et al. ................ 357/71 |
| 5,045,635 A | 9/1991 | Kaplo et al. ............ 174/35 GC |
| 5,071,518 A | 12/1991 | Pan |
| 5,084,412 A | 1/1992 | Nakasaki .................... 437/189 |
| 5,100,499 A | 3/1992 | Douglas ..................... 156/635 |
| 5,130,274 A | 7/1992 | Harper et al. ............... 437/195 |
| 5,148,260 A | 9/1992 | Inoue et al. ................... 357/67 |
| 5,158,986 A | 10/1992 | Cha et al. ..................... 521/82 |
| 5,171,713 A * | 12/1992 | Matthews ..................... 438/31 |
| 5,173,442 A | 12/1992 | Carey ......................... 437/173 |
| 5,231,036 A | 7/1993 | Miyauchi et al. |
| 5,231,056 A | 7/1993 | Sandhu ....................... 437/200 |
| 5,240,878 A | 8/1993 | Fitzsimmons et al. ...... 437/187 |
| 5,243,222 A | 9/1993 | Harper et al. ............... 257/774 |
| 5,256,205 A | 10/1993 | Schmitt, III et al. ........ 118/723 |
| 5,324,683 A | 6/1994 | Fitch et al. ................... 437/65 |
| 5,324,684 A | 6/1994 | Kermani et al. .............. 437/95 |
| 5,334,356 A | 8/1994 | Baldwin et al. ............. 422/133 |
| 5,336,914 A | 8/1994 | Andoh ........................ 257/368 |
| 5,354,712 A | 10/1994 | Ho et al. ..................... 437/195 |
| 5,371,042 A | 12/1994 | Ong ........................... 437/194 |
| 5,374,849 A | 12/1994 | Tada |
| 5,384,284 A | 1/1995 | Doan et al. ................. 437/190 |
| 5,399,897 A | 3/1995 | Cunningham et al. ...... 257/467 |
| 5,401,680 A | 3/1995 | Abt et al. |
| 5,408,742 A | 4/1995 | Zaidel et al. .................. 29/846 |
| 5,413,687 A | 5/1995 | Barton et al. .......... 204/192.14 |
| 5,413,962 A | 5/1995 | Lur et al. .................... 437/195 |
| 5,424,030 A | 6/1995 | Takahashi ................... 420/473 |
| 5,426,330 A | 6/1995 | Joshi et al. .................. 257/752 |
| 5,442,237 A | 8/1995 | Hughes et al. .............. 257/759 |
| 5,444,015 A | 8/1995 | Aitken et al. ............... 437/182 |
| 5,447,887 A * | 9/1995 | Filipiak et al. .............. 438/644 |
| 5,457,344 A | 10/1995 | Bartelink .................... 257/737 |
| 5,470,789 A | 11/1995 | Misawa ...................... 437/190 |
| 5,470,801 A | 11/1995 | Kapoor et al. .............. 437/238 |
| 5,485,037 A | 1/1996 | Marrs ......................... 257/712 |
| 5,495,667 A | 3/1996 | Farnworth et al. ........... 29/843 |
| 5,506,449 A | 4/1996 | Nakano et al. ............. 257/758 |
| 5,510,645 A | 4/1996 | Fitch et al. ................. 257/522 |
| 5,538,922 A | 7/1996 | Cooper et al. .............. 437/195 |
| 5,539,060 A | 7/1996 | Tsunogae et al. ........... 525/338 |
| 5,578,146 A | 11/1996 | Grant et al. ................ 148/437 |
| 5,595,937 A | 1/1997 | Mikagi ....................... 437/192 |
| 5,609,721 A | 3/1997 | Tsukune et al. .......... 156/646.1 |
| 5,633,200 A | 5/1997 | Hu |
| 5,635,253 A | 6/1997 | Canaperi et al. ............. 427/437 |
| 5,654,245 A | 8/1997 | Allen .......................... 438/629 |
| 5,667,600 A | 9/1997 | Grensing et al. ............ 148/437 |
| 5,670,420 A | 9/1997 | Choi .......................... 437/189 |
| 5,674,787 A | 10/1997 | Zhao et al. .................. 437/230 |
| 5,679,608 A | 10/1997 | Cheung et al. .............. 437/195 |
| 5,681,441 A | 10/1997 | Svendsen et al. ........... 205/114 |
| 5,693,563 A | 12/1997 | Teong |
| 5,695,810 A | 12/1997 | Dubin et al. .................. 427/96 |
| 5,719,089 A | 2/1998 | Cherng et al. .............. 438/637 |
| 5,719,410 A | 2/1998 | Suehiro et al. ................ 257/77 |
| 5,719,447 A | 2/1998 | Gardner |
| 5,725,689 A | 3/1998 | Nishida et al. .............. 148/320 |
| 5,739,579 A | 4/1998 | Chiang et al. ............... 257/635 |
| 5,763,953 A | 6/1998 | Iijima et al. ................. 257/762 |
| 5,780,358 A | 7/1998 | Zhou .......................... 438/645 |
| 5,785,570 A | 7/1998 | Bruni ........................... 445/52 |
| 5,789,264 A | 8/1998 | Chung |
| 5,792,522 A | 8/1998 | Jin et al. ..................... 427/575 |
| 5,801,098 A | 9/1998 | Fiordalice et al. .......... 438/653 |
| 5,814,557 A | 9/1998 | Venkatraman et al. ...... 438/622 |
| 5,821,168 A | 10/1998 | Jain ............................ 438/692 |
| 5,824,599 A | 10/1998 | Schacham-Diamand et al. .......................... 438/678 |
| 5,840,625 A | 11/1998 | Feldner |
| 5,852,871 A | 12/1998 | Khandros ..................... 29/843 |
| 5,858,877 A | 1/1999 | Dennison et al. ........... 438/700 |
| 5,891,797 A | 4/1999 | Farrar ......................... 438/619 |
| 5,891,804 A | 4/1999 | Havemann et al. ......... 438/674 |
| 5,895,740 A | 4/1999 | Chien et al. ................. 430/313 |
| 5,897,370 A | 4/1999 | Joshi et al. .................. 438/632 |
| 5,899,740 A | 5/1999 | Kwon |
| 5,907,772 A | 5/1999 | Iwasaki ...................... 438/253 |
| 5,911,113 A | 6/1999 | Yao et al. .................... 438/649 |
| 5,925,930 A | 7/1999 | Farnworth et al. .......... 257/737 |
| 5,930,669 A | 7/1999 | Uzoh .......................... 438/627 |
| 5,932,928 A | 8/1999 | Clampitt ..................... 257/758 |
| 5,940,733 A | 8/1999 | Beinglass et al. ........... 438/655 |
| 5,948,467 A | 9/1999 | Nguyen et al. ................ 427/99 |
| 5,962,923 A | 10/1999 | Xu et al. ..................... 257/774 |
| 5,972,179 A | 10/1999 | Chittipeddi et al. ... 204/192.17 |
| 5,972,804 A | 10/1999 | Tobin et al. ................. 438/786 |
| 5,976,710 A | 11/1999 | Sachdev et al. ............. 428/620 |
| 5,981,350 A | 11/1999 | Geusic et al. ............... 438/386 |
| 5,985,759 A | 11/1999 | Kim et al. ................... 438/653 |
| 5,989,623 A | 11/1999 | Chen et al. ................... 427/97 |
| 5,994,777 A | 11/1999 | Farrar ......................... 257/758 |
| 6,004,884 A | 12/1999 | Abraham .................... 438/714 |
| 6,008,117 A | 12/1999 | Hong et al. ................. 438/629 |
| 6,015,465 A | 1/2000 | Kholodenko et al. ....... 118/719 |
| 6,015,738 A | 1/2000 | Levy et al. .................. 438/275 |
| 6,017,820 A | 1/2000 | Ting et al. ................... 438/689 |
| 6,025,261 A | 2/2000 | Farrar et al. ................ 438/619 |
| 6,028,362 A | 2/2000 | Omura |
| 6,030,877 A | 2/2000 | Lee et al. .................... 438/381 |
| 6,030,895 A | 2/2000 | Joshi et al. |
| 6,037,248 A | 3/2000 | Ahn ............................ 438/619 |
| 6,057,226 A | 5/2000 | Wong .......................... 438/623 |
| 6,065,424 A | 5/2000 | Shacham-Diamand et al. .......................... 118/696 |
| 6,069,068 A | 5/2000 | Rathore et al. .............. 438/628 |
| 6,071,810 A | 6/2000 | Wada et al. ................. 438/635 |
| 6,075,278 A | 6/2000 | Farrar ......................... 257/522 |
| 6,075,287 A | 6/2000 | Ingraham et al. |
| 6,091,136 A | 7/2000 | Jiang et al. .................. 257/676 |
| 6,091,475 A | 7/2000 | Ogino et al. ................ 349/149 |
| 6,100,193 A | 8/2000 | Suehiro et al. .............. 438/685 |
| 6,126,989 A | 10/2000 | Robinson et al. ............. 427/97 |
| 6,136,095 A | 10/2000 | Xu et al. ..................... 118/719 |

| | | | |
|---|---|---|---|
| 6,139,699 A | 10/2000 | Chiang et al. | 204/192.15 |
| 6,140,228 A | 10/2000 | Shan et al. | 438/653 |
| 6,140,234 A | 10/2000 | Uzoh et al. | 438/678 |
| 6,143,646 A | 11/2000 | Wetzel | 438/637 |
| 6,143,655 A | 11/2000 | Forbes et al. | |
| 6,143,671 A | 11/2000 | Sugai | |
| 6,150,214 A | 11/2000 | Kaeriyama | |
| 6,150,261 A | 11/2000 | Hsu et al. | 438/640 |
| 6,153,507 A | 11/2000 | Mikagi | 438/618 |
| 6,159,769 A | 12/2000 | Farnworth et al. | 438/108 |
| 6,169,024 B1 | 1/2001 | Hussein | |
| 6,171,661 B1 | 1/2001 | Zheng et al. | 427/535 |
| 6,174,804 B1 | 1/2001 | Hsu | |
| 6,177,350 B1 | 1/2001 | Sundarrajan et al. | 438/688 |
| 6,183,564 B1 | 2/2001 | Reynolds et al. | 118/719 |
| 6,187,656 B1 | 2/2001 | Lu et al. | 438/592 |
| 6,190,732 B1 | 2/2001 | Omstead et al. | 118/729 |
| 6,197,688 B1 | 3/2001 | Simpson | 438/678 |
| 6,204,065 B1 | 3/2001 | Ochiai | 436/66 |
| 6,207,222 B1 | 3/2001 | Chen et al. | 427/97 |
| 6,207,553 B1 | 3/2001 | Buynoski et al. | 438/622 |
| 6,207,558 B1 | 3/2001 | Singhvi et al. | 438/648 |
| 6,208,016 B1 | 3/2001 | Farrar | 257/643 |
| 6,211,049 B1 | 4/2001 | Farrar | 438/597 |
| 6,211,073 B1 | 4/2001 | Ahn | 438/653 |
| 6,215,186 B1 | 4/2001 | Konecni et al. | |
| 6,221,763 B1 | 4/2001 | Gilton | 438/643 |
| 6,232,219 B1 | 5/2001 | Blalock et al. | 438/637 |
| 6,249,056 B1 | 6/2001 | Kwon et al. | 257/758 |
| 6,258,707 B1 | 7/2001 | Uzoh | |
| 6,265,311 B1 | 7/2001 | Hautala et al. | 438/680 |
| 6,265,811 B1 | 7/2001 | Takeuchi et al. | |
| 6,271,592 B1 | 8/2001 | Kim et al. | 257/751 |
| 6,284,656 B1 | 9/2001 | Farrar | 438/687 |
| 6,287,954 B1 | 9/2001 | Ashley et al. | 438/622 |
| 6,288,442 B1 | 9/2001 | Farrar | 257/678 |
| 6,288,447 B1 | 9/2001 | Amishiro et al. | |
| 6,288,905 B1 | 9/2001 | Chung | 361/771 |
| 6,323,543 B1 | 11/2001 | Jiang et al. | 257/676 |
| 6,323,553 B1 | 11/2001 | Hsu et al. | 257/751 |
| 6,326,303 B1 | 12/2001 | Robinson et al. | 438/678 |
| 6,342,448 B1 | 1/2002 | Lin et al. | 438/687 |
| 6,358,842 B1 | 3/2002 | Zhou et al. | 438/633 |
| 6,359,328 B1 | 3/2002 | Dubin | 257/622 |
| 6,368,954 B1 | 4/2002 | Lopatin et al. | 438/627 |
| 6,372,622 B1 | 4/2002 | Tan et al. | 438/612 |
| 6,376,370 B1 | 4/2002 | Farrar | 438/678 |
| 6,383,920 B1 | 5/2002 | Wang et al. | 438/639 |
| 6,387,542 B1 | 5/2002 | Kozlov et al. | 428/673 |
| 6,399,489 B1 | 6/2002 | M'Saad et al. | 438/680 |
| 6,403,481 B1 | 6/2002 | Matsuda et al. | 438/687 |
| 6,417,094 B1 | 7/2002 | Zhao et al. | |
| 6,429,120 B1 | 8/2002 | Ahn et al. | 438/635 |
| 6,492,266 B1 | 12/2002 | Ngo et al. | |
| 6,518,198 B1 | 2/2003 | Klein | 438/758 |
| 6,589,863 B1 | 7/2003 | Usami | |
| 6,943,090 B1 | 9/2005 | Farrar | |
| 2001/0002333 A1 | 5/2001 | Huang et al. | 438/637 |
| 2001/0054771 A1 | 12/2001 | Wark et al. | |
| 2002/0014646 A1 | 2/2002 | Tsu et al. | 257/296 |
| 2002/0028552 A1 | 3/2002 | Lee et al. | 438/243 |
| 2002/0096768 A1 | 7/2002 | Joshi | 257/750 |
| 2002/0109233 A1 | 8/2002 | Farrar | 257/762 |
| 2003/0034560 A1 | 2/2003 | Matsuse et al. | |
| 2005/0023697 A1 | 2/2005 | Anh et al. | |

OTHER PUBLICATIONS

American Society for Metals, "Properties and Selection: Nonferrous Alloys and Pure Metals", *Metals Handbook, 9th ed., vol. 2*, Metals Park, Ohio,(1979),Table of Contents.

Anonymous, "Improved Metallurgy for Wiring Very Large Scale Integrated Circuits", *International Technology Disclosures, 4*, Abstract,(1986),1 page.

Bhansali, S. , et al., "A novel technique for fabrication of metallic strutures on polymide by selective electroless copper plating using ion implantation", *Thin Solid Films, 270, No. 1/02*, (1995),pp. 489–492.

Bhansali, S. , et al., "Selective electroless copper plating on silicon seeded by copper ion implantation", *Thin Solid Films, 253*, (1994),pp. 391–394.

Braud, F. , "Ultra Thin Diffusion Barriers for Cu Interconnections at The Gigabit Generation and Beyond", *VMIC Conference Proceedings*, (1996),pp. 174–179.

Craig, J. D., "Polymide Coatings", *Packaging, Electronic Materials Handbook, vol. 1*, ASM International Handbook Committee (eds.), ASM International, Materials Park, OH,(1989),767–772.

De Felipe, T. S., et al., "Electrical Stability and Microstructural Evolution in Thin Films of High Conductivity Copper Alloys", *Interconnect Technology, 1999, IEEE International Conference*, (May 24–26, 1999),293–295.

Ding, "Copper Barrier, Seed Layer and Planerization Technologies", *VMIC Conference Proceedings*, (1997),pp. 87–92.

Dubin, V. M., et al., "Selective and Blanket Electroless Copper Deposition for Ultralarge Scale Integration", *J. Electrochem. Soc., 144(3)*, (1997),pp. 898–908.

Edelstein, D. , "Full Copper Wiring in a Sub–0.25 micrometer CMOS ULSI Technology", *IEDM*, (1997),pp. 773–776.

Ernst, et al., "Growth Model for Metal Films on Oxide Surface: Cu on ZnO(0001)–O", *Physical Review B, 47*, (May 15, 1993),13782–13796.

Hirao, S. , et al., "A Novel Copper Reflow Process Using Dual Wetting Layers", *1997 Symposium on VLSI Technology*, Digest of Technical Papers,(1997),57–58.

Hirata, A. , et al., "WSiN Diffusion Barrier Formed by ECR Plasma Nitridation for Copper Damascene Interconnection", *16th Solid State Devices and Materials*, 1998 pp. 260–261.

Holloway, K. , et al., "Tantalum as a diffusion barrier between copper and silicon", *Appl. Phys. Lett., 57(17)*, (Oct. 1990),pp. 1736–1738.

Hu, C. K., et al., "Extendibility of Cu Damascene to 0.1 micrometer Wide Interconnections", *Mat. Res. Soc. Symp. Proc. 514*, (1998),pp. 287–292.

Iijima, T. , "Microstructures and Electrical Properties of Amorphous W–Si–N Barrier Layer for Cu Interconnections", *1996 VMIC Conference*, (1996),pp. 168–173.

Izaki, M. , et al., "Characterization of Transparent Zinc Oxide Films Prepared by Electrochemical Reaction", *Journal of the Electrochemical Society, 144*, (Jun. 1997),1949–1952.

Jayaraj, K. , et al., "Low Dielectric Constant Microcellular Foams", *Proceedings from the Seventh Meeting of the DuPont Symposium on Polymides in Microelectronics*, (Sep. 1996),474–501.

Jin, C. , et al., "Porous Xerogel Films as Ultra–low Permittivity Dielectrics for ULSI Interconnect Applications", *Conference Proceedings ULSI XII—1997 Materials Research Society*, (1997),463–469.

Kang, H. K., et al., "Grain Structure and Electromigration Properties of CVD CU Metallization", *Proceedings of the 10th International VLSI Multilevel Interconnection Conference*, (Jun. 8–9, 1993),223–229.

Laursen, T., "Encapsulation of Copper by Nitridation of Cu–Ti Alloy/Bilayer Structures", *International Conference on Metallurgical Coatings and Thin Films*, Abstract No. H1.03, San Diego, CA,(Apr. 1997,)p. 309.

Len, V., et al., "An investigation into the performance of diffusion barrier materials against copper diffusion using metal–oxide–semiconductor (MOS) capacitor structures", *Solid–State Electronics, 43*, (1999),pp. 1045–1049.

Lyman, T., et al., "Metallography, Structures and Phase Diagrams", *Metals Handbook, 8*, American Society for Metals, Metals Park, Ohio,(1989),pp. 300 & 302.

Marcadal, C., "OMCVD Copper Process for Dual Damascene Metallization", *VMIC Conference*, ISMIC,(1997),pp. 93–97.

Miyake, T., et al., "Atomic Hydrogen Enhanced Reflow of Copper", *Applied Physics Letters, 70(10)*, (1997), 1239–1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE, 2335*, (1994),pp. 80–90.

Nakao, S., et al., "Thin and Low–Resistivity Tantalum Nitride Diffusion Barrier and Giant–Grain Copper Interconnects for Advanced ULSI Metallization", *Japanese Journal of Applied Physics, 38(4B)*, (Apr. 1999),pp. 262–263.

Newboe, B., et al., "Applied Materials Announces First Barrier/Seed Layer System For Copper Interconnects", *Applied Materials*, (1997), pp. 1–4.

Palleau, J., et al., "Refractory Metal Encapsulation in Copper Wiring", *Advanced Metallization for Devices and Circuits–Science. Technology and Manufacturability, Materials Research Society Symposium Proceedings, 337*, (Apr. 1994),225–231.

Park, C. W., et al., "Activation Energy for Electromigration in Cu Films", *Applied Physics Letters, 59(2)*, (Jul. 6, 1991), 175–177.

Radzimski, Z. J., et al., "Directional Copper Deposition using d–c Magnetron Self–sputtering", *J. Vac. Sci. Technol. B, 16(3)*, (1998),pp. 1102–1106.

Ramos, T, et al., "Nanoporous Silica for Dielectric Constant Less Than 2", *Conference Proceedings ULSI XII—1997 Materials Research Society*, (1997),455–461.

Rossnagel, S. M., "Magnetron Sputter Deposition of Interconnect Applications", *Conference Proceedings, ULSI XI*, (1996),227–232.

Rossnagel, S. M., et al., "Metal ion deposition from ionized mangetron sputtering discharge", *J. Vac. Sci. Technol. B, 12(1)*, (1994),pp. 449–453.

Ryan, J. G., "Copper Interconnects for Advanced Logic and DRAM", Extended Abstracts of the 1998 International Conference on Solid–State Devices and Materials, Hiroshima, (1998),pp. 258–259.

Ryu, C., et al., "Barriers for copper interconnections", *Solid State Technology*, (Apr. 1999),pp. 53,54,56.

Saarivirta, M. J., "High Conductivity Copper Rich Cu–Zr Alloys", *Transactions of the Metallurgical Society of AIME, 218*, (1960),pp. 431–437.

Senzaki, Y., "Chemical Vapor Deposition of Copper using a New Liquid Precursor with Improved Thermal Stability", *Conference Proceedings ULSI XIII, Materials Research Society*, (1998),pp. 451–455.

Shacham–Diamand, Y., "100 nm Wide Copper Lines Made by Selective Electroless Deposition", *Journal of Micromechanics and Microengineering, 1*, (Mar. 1991),66–72.

Singer, Ferdinand L., "Strength of Materials", *Harper & Brothers, New York*, (1951),229–32.

Srivatsa, A. R., et al., "Jet Vapor Deposition: an Alternative to Electrodeposition", *Surface Engineering, 11*, (1995), 75–77.

Tao, J., et al., "Electromigration Characteristics of Copper Interconnects", *IEEE Electron Devices Letters, 14(5)*, (May 1993),249–251.

Ting, C. H., "Methods and Needs for Low K Materials Research", *Materials Research Society Symposium Proceedings, vol. 381*, Low–Dielectric Constant Materials—Synthesis and Applications in Microelectronics, Lu, T.M., et al., (eds.), San Francisco, CA,(Apr. 17–19, 1995),3–17.

Van Horn, K. R., "Aluminum vol. III Fabrication and Finishing", *American Society for Metals*, Metals Park, OH,(1967),468.

Van Vlack, Lawrence H., "Elements of Materials Science", *Addison–Wesley Publishing Co., Inc.* Reading, MA, (1959), 468.

Venkatesan, S., "A High Performance 1.8V, 0.20 micrometer CMOS Technology with Copper Metallization", *IEEE*, (1997),pp. 769–772.

Wang, X. W., et al., "Highly Reliable Silicon Nitride Thin Films Made by Jet Vapor Deposition", *Japanese Journal of Applied Physics, vol. 34, Part1, No. 2B*, (Feb. 1995),955–958.

Wolf, S., et al., *Silicon Processing for the VLSI Era, vol. 1—Process Technology*, Lattice Press, Sunset Beach, CA,(1986),514–538.

Yeh, J. L., et al., "Selective Copper plating of Polysilicon Surface Micromachined Structures", *Solid–State Sensor and Actuator Workshop*, (1998),pp. 248–251.

Zhang, J., et al., "Investigations of photo–induced decomposition of palladium acetate for electroless copper plating", *Thin Solid Films, 318*, (1998),pp. 234–238.

In: *Metals Handbook, Ninth Edition, vol. 2*, Properties and Selection: Nonferrous Alloys and Pure Metals, ASM Handbook Committee, (eds.), American Society for Metals, Metals Park, OH,(1989),157, 395.

In: *Kirk–Othmer Concise Encyclopedia of Chemical Technology*, Grayson, M., (ed.), John Wiley & Sons, Inc., New York, NY,(1985),p. 433–435, 926–938.

"Brooks Model 5964 High Performance Metal Seal Mass Flow Controller (Introduced in 1991)", *Brooks Instrument*, http://www.frco.com/brooks/semiconductor/products1i.html,(1991),1 page.

Abe, K., et al., "Sub–half Micron Copper Interconnects Using Reflow of Sputtered Copper Films", *VLSI Multilevel Interconnection Conference*, (Jun. 25–27, 1995),308–311.

Andricacos, P. C., "Copper On–Chip Interconnections", *The Electrochemical Society Interface*, (1999),pp. 32–37.

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract,(Jul. 10, 1988),1 p.

Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, (1997),p. 315.

Bai, G., "Copper Interconnection Deposition Techniques and Integration", *1996 Symposium on VLSI Technology*, Digest of Technical Papers,(1996),48–49.

Bernier, M., et al., "Laser processing of palladium for selective electroless copper plating", *SPIE, 2045*, (1994),pp. 330–337.

Cabrera, A. L., et al., "Oxidation protection for a variety of transition metals and copper via surface silicides formed with silane containing atmospheres", *J. Mater. Res., 6(1)*, (1991),pp. 71–79.

Dudzinski, N., et al., "The Youngs Modulus of Some Aluminim Alloys", *J. Institute of Metals, vol. LXXIV*, (1947–48),pp. 291–314.

Dushman, S., et al., *Scientific Foundations of Vacuum Technique, 2nd Edition*, John Wiley and Sons,(1962),1–806.

Eisenbraun, E. T., et al., "Selective and Blanket Low–Temperature Copper CVD for Multilevel Metallization in ULSI", *Conference Proceedings ULSI–VII*, (1992),5 pages.

Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),pp. 283–285.

Fukuda, T., et al., "0.5 –micrometer–Pitch Copper–Dual–Damascene Metallization Using Organic SOG (k=2.9) for 0.18–micrometer CMOS Applications", *IEEE*, (1999),pp. 619–622.

Gladfelter, W. L., et al., "Trimethylamine Complexes of Alane as Precursors for the Low–Pressure Chemical Vapor Deposition of Aluminum", *Chemistry of Materials, 1*, (1989),pp. 339–343.

Godbey, D. J., et al., "Copper Diffusion in Organic Polymer Resists and Inter–level Dielectrics", *Thin Solid Films, 308–309*, (1997),pp. 470–474.

Grimblot, J., et al., "II. Oxidation of Aluminum Films", *J. Electrochem., 129*, (1982),pp. 2369–2372.

Hattangady, S. V., et al., "Integrated processing of silicon oxynitride films by combined plasma and rapid–thermal processing", *J. Vac. Sci. Technol. A, 14(6)*, (1996),pp. 3017–3023.

Hymes, S., et al., "Passivation of Copper by Silicide Formation in Dilute Silane", *Conference Proceedings ULSI–VII*, (1992),pp. 425–431.

Jeon, Y., et al., "Low–Temperature Fabrication of Polycrystalline Silicon Thin Films by ECR Pecvd", *The Electrochemical Society Proceedings, 94(35)*, (1995),pp. 103–114.

Kaloyeros, A. E., et al., "Blanket and Selective Copper CVD from Cu(FOD)2 for Multilevel Metallization", *Mat. Res. Soc. Symp. Proc.*, vol. 181,(1990),6 pages.

Kamins, T. I., "Structure and Properties of LPCVD Silicon Films", *J. Electrochem. Soc.: Solid–State Science and Technology, 127*, (Mar. 1980),pp. 686–690.

Keppner, H., et al., "The "Micromorph" Cell: A New Way to High–Efficiency–Low–Temperature Crystalline Silicon Thin–Film Cell Manufacturing", *Mat. Res. Soc. Symp. Proc., 452*, (1997),pp. 865–876.

Kiang, M., et al., "Pd/Si plasma immersion ion implantation for selective electroless copper plating on SiO2", *Appl. Phys. Lett., 60*, (1992),pp. 2767–2769.

Kistiakowsky, G. B., et al., "Reactions of Nitrogen Atoms. I. Oxygen and Oxides of Nitrogen", *The Journal of Chemical Physics, 27(5)*, (1957),pp. 1141–1149.

Klaus, J W., et al., "Atomic Layer Deposition of Tungsten Nitride Films Using Sequential Surface Reactions", *Journal of the Electrochemical Society, vol. 147, No.3*, (Mar. 2000), 1175–1181.

Miller, R. D., et al., "Low Dielectric Constant Polyimides and Polyimide Nanofoams", *Seventh Meeting of the DuPont Symposium on Polymides in Microelectronics*, (Sep. 1996), pp. 443–473.

Min, J., "Metal–organic atomic–layer deposition of titanium–silicon–nitride films", *Applied Physics Letters, 75(11)*, (1999),1521–1523.

Okamoto, Y., et al., "Magnetically Excited Plasma Oxynitridation of Si at Room Temperature", *Jpn. J. Appl. Phys., 34*, (1995),pp. L955–957.

Rath, J. K., et al., "Low–Temperature deposition of polycrystalline silicon thin films by hot–wire CVD", *Solar Energy Materials and Solar Cells, 48*, (1997),pp. 269–277.

Ray, S. K., et al., "Flourine–enhanced nitridation of silicon at low temperatures in a microwave plasma", *J. Appl. Phys., 70(3)*, (1991),pp. 1874–1876.

Shacham–Diamond, Y., et al., "Copper electroless deposition technology for ultra–large–scale–integration (ULSI) metallization", *Microelectronic Engineering, 33*, (1997),pp. 47–58.

Stroud, P. T., et al., "Preferential deposition of silver induced by low energy gold ion implantation", *Thin Solid Films, Switzerland, vol. 9, No. 2, XP000993098*, (Feb. 1972), 273–281.

Tsukada, T., et al., "Adhesion of copper films on ABS polymers deposited in an internal magnet magnetron sputtering system", *J. Vac. Sci. Technol., 16(2)*, (1979),348–351.

Vossen, J. L., et al., *Thin Film Processes II*, Academic Press, Inc.,(1991),1–866.

Wang, K., et al., "Very Low Temperature Deposition of Polycrystalline Silicon Films with Micro–Meter–Order Grains on SiO2", *Mat. Res. Soc. Symp. Proc., 355*, (1995), pp. 581–586.

Winters, H. F., et al., "Influence of Surface Absorption Characteristics on Reactivity Sputtered Films Grown in the Biased and Unbiased Modes", *J. Appl. Phys., 43(3)*, (1972), pp. 794–799.

Wolf, S., "Chapter 4: Multilevel–Interconnect Technology for VLSI and ULSI", *In: Silicon Processing for the VLSI Era, vol. 2 Process Integration*, Lattice Press, Sunset Beach, CA,(1990),176–297.

* cited by examiner

MULTILEVEL COPPER INTERCONNECT WITH DOUBLE PASSIVATION

RELATED APPLICATION(S)

This application is a Divisional of U.S. application Ser. No. 09/584,157, filed May 31, 2000 U.S. Pat. No. 6,674,167 B1, which is incorporated herein by reference.

TECHNICAL FIELD

This invention relates generally to integrated circuits and in particular to multi layer metal wiring interconnects in an integrated circuit assembly.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together with aluminum wires to define a specific electric circuit, such as a computer memory. The aluminum wires are typically about one micron thick, or about 100 times thinner than a human hair.

To form the aluminum wires, fabricators sometimes use a dual-damascene metallization technique, which takes its name from the ancient Damascene metalworking art of inlaying metal in grooves or channels to form ornamental patterns. The dual-damascene technique entails covering the components on a wafer with an insulative layer of silicon dioxide, etching small holes in the insulative layer to expose portions of the components underneath, and subsequently etching shallow trenches from hole to hole to define a wiring pattern.

Etching the trenches and holes entails forming a mask, using photolithographic techniques, on the insulative layer. The masks, which typically consists of a material called photoresist, shields some portions of the insulative layer from the etchant and allows the etchant to dissolve away other portions. After etching, fabricators remove the mask to expose the patterned insulative layer. They then blanket the entire insulative layer with a thin sheet of aluminum and polish off the excess, leaving behind aluminum vias, or contact plugs, in the holes and thin aluminum wires in the trenches.

The complexity of some integrated circuits demand several interconnected levels of wiring. Some circuits, such as microprocessors, have five or six interconnected levels, with each level formed by repeating the basic dual-damascene produce. For example, to form a second wiring level, fabricators apply a new insulative layer over the first wiring layer, form another mask on the new layer, etch holes and trenches into the new layer, remove the mask, blanket the new layer with aluminum, before finally polishing off the excess to complete it.

In recent years, researchers have begun using copper instead of aluminum to form integrated-circuit wiring, because copper offers lower electrical resistance and better reliability at smaller dimensions. Fabrication of copper-wired integrated circuits sometimes follows an extension of the dual-damascene method which includes an additional step of lining the holes and trenches of an insulative layer with a copper-diffusion barrier before blanketing the layer with copper and polishing off the excess. (The diffusion barrier is generally necessary because copper atoms readily diffuse through common insulators, such as silicon dioxide, resulting in unreliable or inoperative integrated circuits.) Typically, the copper-diffusion barrier is more than 30 nanometers thick and consists of tantalum, tantalum nitride, tantalum-silicon-nitride, titanium nitride, or tungsten nitride. Filling the barrier-lined holes and trenches with copper generally entails depositing a thin copper seed layer on the copper-diffusion barrier, electroplating copper on the seed layer, and then polishing off the excess.

The present inventors identified at least two problems with using the extended dual-damascene technique for making the copper wiring. The first is that typical copper-diffusion barriers add appreciable resistance to the copper wiring, and thus negate some promised performance advantages. And, the second is that the number of separate procedures or steps necessary to make the copper wiring using the extended technique makes fabrication both costly and time consuming.

In a copending application by K. Y. Ahn and L. Forbes, entitled "Methods for Making Integrated-Circuit Wiring from Copper, Silver, Gold, and other Metals," application Ser. No. 09/484,303, an electroplated copper technology was disclosed. After fabrication of multilevel copper structure using sacrificial layers of photoresist, a very thin WSiN diffusion barrier was deposited on the copper air-bridge structure by deposition of WSi by CVD, followed by ECR plasma nitridation. The space between the metal lines was then filled with a dielectric material of choice in one step. The WSiN layer thus formed serves to prevent the diffusion of copper into the dielectric material. Furthermore, any unreacted silicon can be converted to a very thin film of $SiO_2$ or $Si_3N_4$ in order to provide a substantial amount of protection against electrochemical corrosion due to moisture and impurities in the dielectric layer.

The passivation bestowed by the extremely thin silicide/oxide or silicide/nitride layers formed above may prove to be quite sufficient for protecting the metal line air-bridge structures. On the other hand, the metal line air-bridge 101 is a three-dimensional structure having a large surface area in the aggregate with very small spacings between its numerous top, bottom and side surfaces. Hence, it is possible that the silicide/($SiO_2$ or $Si_3N_4$) barriers may contain a very small number of localized structural and chemical defects which could serve as corrosion nucleation centers.

Thus, even with the above described approaches, there is a need for yet improved structures and methods for multilevel Copper interconnects for ULSI circuits.

SUMMARY OF THE INVENTION

The above mentioned problems associated with integrated circuit size and performance, the via and metal line formation process, and other problems are addressed by the present invention and will be understood by reading and studying the following specification.

The structures and methods of the present invention include a method for forming multilevel wiring interconnects in an integrated circuit assembly. The method includes forming a number of multilayer metal lines separated by a number of air gaps above a substrate. A silicide layer is formed on the number of multilayer metal lines. The silicide layer is oxidized. And, a low dielectric constant insulator is deposited to fill a number of interstices created by the number of air gaps between the number of multilayer metal lines. In one embodiment, forming the number of multilayer metal lines includes a first conductor bridge level. In one embodiment, forming a silicide layer on the number of multilayer metal lines includes using pyrolysis of silane in the presence of a dopant source at a temperature of approximately 325 degrees Celsius. Also, in one embodiment, a metal layer is formed on the oxided silicide layer. The metal layer includes a metal layer selected from the group consisting of Aluminum, Chromium, Titanium, and Zirconium. In one embodiment, the metal layer includes a layer of Aluminum oxide.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
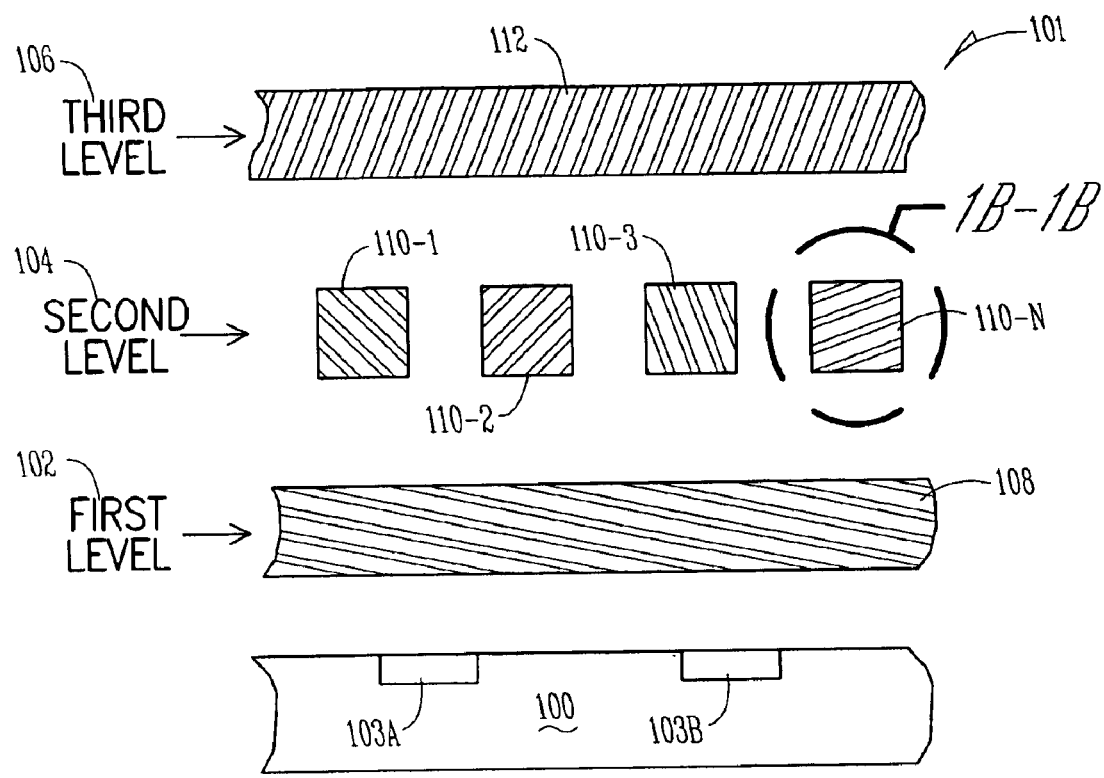
FIGS. 1A–1D are cross sectional views of a fabrication embodiment for a multilevel wiring interconnect in an integrated circuit assembly according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The purpose of this invention is to disclose alternate methods, materials and processes for forming a diffusion barrier and additional overcoat(s) over the surface of a multilevel metal line air-bridge structure.

FIG. 1A is a cross sectional view of a fabrication embodiment stage for a multilevel wiring interconnect in an integrated circuit assembly according to the teachings of the present invention. The structure shown in FIG. 1A begins from the completion of a multilevel metal line air-bridge structure as disclosed in the commonly assigned U.S. Pat. No. 5,891,797, entitled "Method of Forming a Support Structure for Air Bridge Wiring of an Integrated Circuit," issued Apr. 6, 1999, the same is incorporated herein by reference. FIG. 1A assumes that the multilevel metal line air-bridge has proper support structure as discussed in above referenced patent. Further, FIG. 1A assumes that not only does the multilevel metal line air bridge have proper support, including posts if necessary, but also that design rules are used to avoid areas shadowed by wide metal lines and maximize open spaces in the 3-D structure. An example of the same is disclosed in copending, commonly assigned applications U.S. Ser. No. 09/488098 U.S. Pat. No. 6,429,120 B1 and Ser. No. 09/484303 pending, the same of which are incorporated herein. To achieve the same, those cases mention the manner in which wide metal lines are replaced by individual narrow lines connected in electrical parallels.

As shown in FIG. 1A, the cross sectional view of a multilevel metal line wiring structure 101 includes a number of metal line levels. The embodiment shown in FIG. 1A has a first metal line, second metal line, and third metal line levels, 102, 104 and 106 respectively. In FIG. 1A, a first level metal line 108 is represented as continuous metal line 108 running in a direction parallel to the plane of the drawing page in the first metal line level 102. As shown in FIG. 1A, first metal line 108 is separated by an air gap in this portion the cross sectional view from a substrate 100. As one of ordinary skill in the art will understand upon reading the following disclosure the substrate 100 can include one or more transistors, or semiconductor structures/devices represented as 103A and 103B in FIG. 1A. In FIG. 1A, second metal line level 104 shows a number of second level metal lines 110-1, 110-2, . . . , 110-N which are represented running in a direction perpendicular to the plane of the drawing page. In the cross sectional view of FIG. 1A, the number of second level metal lines 110-1, 110-2, . . . , 110-N are separated from the first level metal line 108 by an air gap in this portion of the cross sectional view. In FIG. 1A, third metal line level 106 shows a third level metal line 112 which is represented as a continuous metal line 112 running in a direction parallel to the plane of the drawing page. As shown in FIG. 1A, third level metal line 112 is separated in this portion of the cross sectional view by an air gap from the number of second level metal lines 110-1, 110-2, . . . , 110-N. One of ordinary skill in the art will understand, upon reading this disclosure, that the embodiment shown in FIG. 1A is only one cross hatched configuration for multilevel metal lines in a multilayer semiconductor circuit. Other metallization circuit design are similarly included in the scope of the present invention.

One of ordinary skill in the art will understand from studying this disclosure together with commonly assigned U.S. Pat. No. 5,891,797, the manner in which the number of multilevel, or multilayer, metal lines can be interconnected between the multilevels to complete electrical connection. The same is not described in more detail in connection with the embodiment of FIG. 1A so as not to obscure the invention. FIG. 1A thus represents one starting point for the multilevel, or multilayer, metallization structure of the present invention. From this starting point, a more detailed description of the present invention's fabrication process proceeds.

Figure 1B:
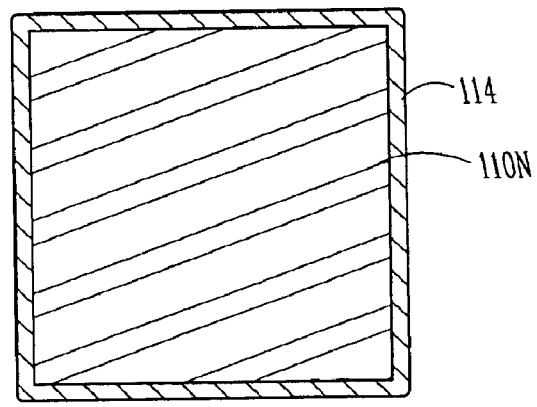

FIG. 1B is an exploded view of a cross section of one of the number of second level metal lines 110-1, 110-2, . . . , 110-N. The exploded view of second level metal line, e.g. second level metal line 110-N, is useful in illustrating, in more detail, the wiring interconnects structure in a subsequent fabrication stage according to the teachings of the present invention. As one of ordinary skill in the art will understand upon reading this disclosure, the subsequently discussed process steps equally apply to and occur on each metal line separated by air gaps in the various metal line levels, e.g. 102, 104 and 106. In one embodiment, each of the metal lines separated by air gaps in the various metal line levels, 102, 104, and 106 in FIG. 1A, include a metal line selected from the group consisting of Aluminum, Copper, Silver, and Gold. As shown in FIG. 1B, according to the teachings of the present invention, a thin layer of silicide 114 is formed by exposing the metal line structure to a diluted silane mixture. This includes forming the thin layer of silicide using pyrolysis of silane in the presence of a dopant source. In one embodiment, exposing the metal line structure to a diluted silane mixture includes exposing the metal lines using a method similar to that disclosed in an article by A. L. Cabrera et al., entitled "Oxidation Protection for a Variety of Transition Metals and Copper via Surface Silicides formed with Silane Containing Atmosphere," *J. Mater. Res.*, 6, no. 1, p. 71–79 (1991), and/or in an article by S. Hymes et al., entitled "Passivation of Copper by Silicide Formation in dilute Silane," *MRS Conf. Proceedings*, ULSI-VII, p. 425–431 (1992). The initial work by Cabrera et al. found that copper silicone coatings were formed at a temperature as low as 350° C. when copper is exposed to a gaseous ambient containing a small concentration (typically <2%) of silane. The silicided copper surface was found to be substantially resistant to electrochemical and atmospheric corrosion. Hymes et al. then did a more systematic research of copper silicidation. Short periods of low temperature (325° C.) exposure to silane produced barely detectable amounts (by RBS) of silicon on the copper surface. However, even these few monolayers of silicide (most likely present as the gamma phase) led to an improvement in the copper corrosion resistance.

Figure 1C:
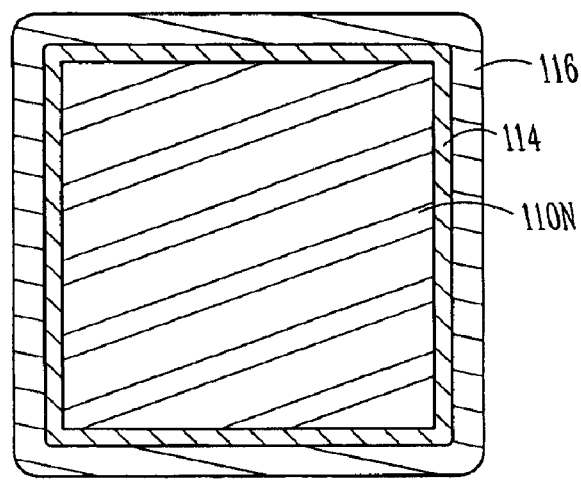

FIG. 1C illustrates the structure following the next sequence of processing steps. As shown in the exploded view of FIG. 1C, the silicide layer 114 can be either oxidized or undergo a nitridation process to create either a silicon dioxide ($SiO_2$) or a silicon nitride ($Si_3N_4$) layer 116. The passivation bestowed by the extremely thin silicide/oxide or silicide/nitride layers 116 formed above may prove to be quite sufficient for protecting the metal line air-bridge structures 101 shown in FIG. 1A. On the other hand, the metal line air-bridge 101 is a three-dimensional structure having a large surface area in the aggregate with very small spacings between its numerous top, bottom and side surfaces. Hence, it is possible that the silicide/($SiO_2$ or $Si_3N_4$) barriers, e.g. 114 and 116, may contain a very small number of localized structural and chemical defects which could serve as corrosion nucleation centers. Thus, the present invention also teaches processes and materials for further enhancing the reliability of the hermetic sealing of the metal line air-bridge structure 101.

According to one embodiment of the present invention, the silicide/($SiO_2$ or $Si_3N_4$) barriers, e.g. 114 and 116, are deposited onto the metal line air-bridge structure 101 by the following method. That is, in FIG. 1B a very thin silicide layer 114 is formed on the number of metal lines by exposing the metal lines to a dilute silane ambient at 325° C. for several minutes. At this relatively low temperature, the inner portion of the silicon layer 114 will react with the metal line to form an extremely thin intermetallic layer of silicide 114. In the embodiment where the number of metal lines are Copper, the inner portion of the silicon layer 114 will react with the metal line to form an extremely thin intermetallic layer of Copper silicide 114. The formation of this compound will serve as a barrier to the continued diffusion of Cu and/or Si and further growth of the silicide phase. Next, as shown in FIG. 1C, most or all of the remaining, unreacted silicon in the outer region will then be converted to: a $SiO_2$ layer 116 by thermal or plasma anodization in an oxygen plasma; or, to a $Si_3N_4$ layer 116 in a nitrogen plasma. Although only a few atomic layers thick, the additional oxide or nitride passivating layer 116 will provide improved hermetic sealing of the underlying copper.

Figure 1D:
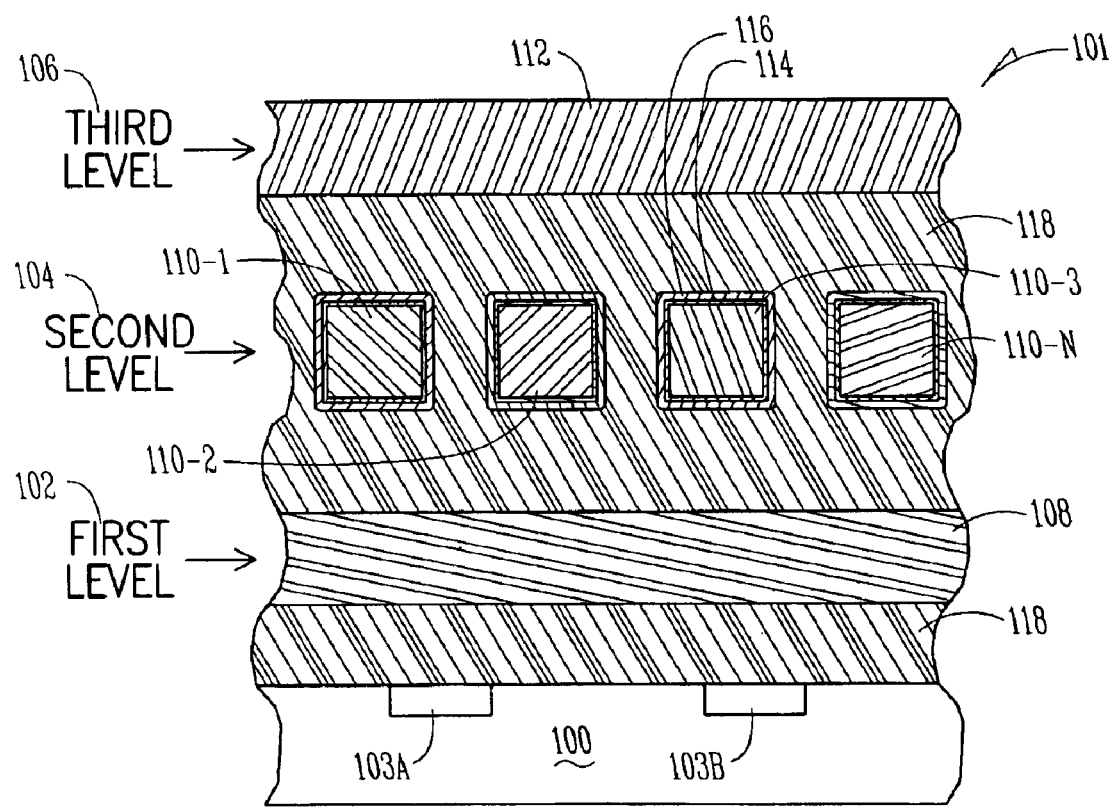

As shown in FIG. 1D, a low dielectric constant insulator 118 can then be deposited in a single step to fill a number of interstices created by the air gaps between the surfaces of the number of multilayer metal lines. As one of ordinary skill in the art will understand upon reading this disclosure, a final CMP step can be used to planarize the structure and remove the insulating oxide (or nitride) and the metal, e.g. Copper, suicide barrier from the top surfaces of the uppermost contact pads of the metal line air-bridge structure 101. Wide latitude can be used in selecting this low dielectric constant insulator 118, e.g. filling polymer, since the hermetic encapsulation is known to be a highly effective barrier that will prevent the transport of ions, molecules and moisture across it. In the absence of such a perfect hermetic barrier, transport of various moieties could serve to induce a number of undesirable events including: localized copper corrosion and ultimate failure of the air-bridge; and, long-term polarization of the polymeric filler material 118 which could lead to the development of unacceptably large, localized fringing fields which would unpredictably interfere with the proper functioning of an underlying transistor array, number of semiconductor devices, e.g. 103A and 103B, and associated circuits in the substrate 100.

An extension of the above approach is to deposit a much thicker silicide layer 114 at a somewhat higher temperature (e.g., in the 300 to 500° C. range) and convert some or all of this to a thicker oxide or nitride protective layer 116. This embodiment is shown in FIG. 1D in which it can be noted that the $SiO_2$ or $Si_3N_4$ layer 116 occupies a significant portion of the spaces, or number of interstices, between adjacent levels of the multilayer metal line structure. In addition to providing even a higher degree of hermetic encapsulation, the use of an appreciably thicker silicon dioxide or silicon nitride encapsulant 116 will provide substantial mechanical strengthening of the metal line air-bridge structure. As one of ordinary skill in the art will understand upon reading this disclosure, the achievable strengthening will depend on the relative thicknesses of the overcoat(s), e.g. layer 116, to the number of metal lines, e.g. copper, as well as the cross-sectional configurations, or circuit layout, of the multilayer metal line air-bridge components. Due to the well-known brittleness of silicon dioxide and silicon nitride when subjected to tensile and/or bending forces, no attempt is made here to quantify the extent of the overcoat(s)/copper structures.

Figure 2A:
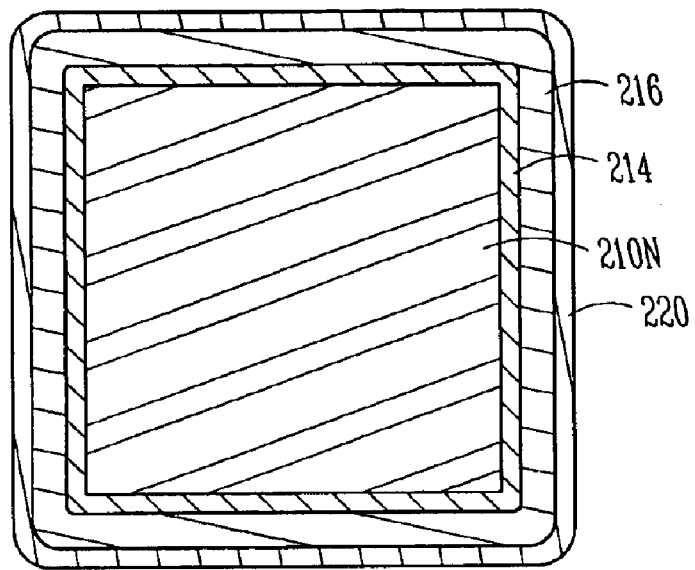
FIGS. 2A–2B illustrate another fabrication embodiment according to the teachings of the present invention.

FIG. 2A illustrates yet another embodiment which expands the possibilities inherent in the present invention. In the embodiment shown in FIG. 2A, the method of the present invention continues from the structure shown in FIG. 1C. In FIG. 2A, a subsequent metal layer 220 is deposited on the $SiO_2$ or $Si_3N_4$ layer 216. According to the teachings of the present invention, the metal layer 220 includes a metal layer 220 selected from the group consisting of Aluminum, Chromium, Titanium, and Zirconium. For example, in one embodiment a metal layer of Aluminum 220 is deposited by a low pressure chemical vapor deposition (LPCVD) process on the multilayer metal line air-bridge structure following the addition and oxidation (or, nitridization) of the thicker silicide layer, e.g. layers 214 and 216. The structure is now as shown in FIG. 2A.

Figure 2B:
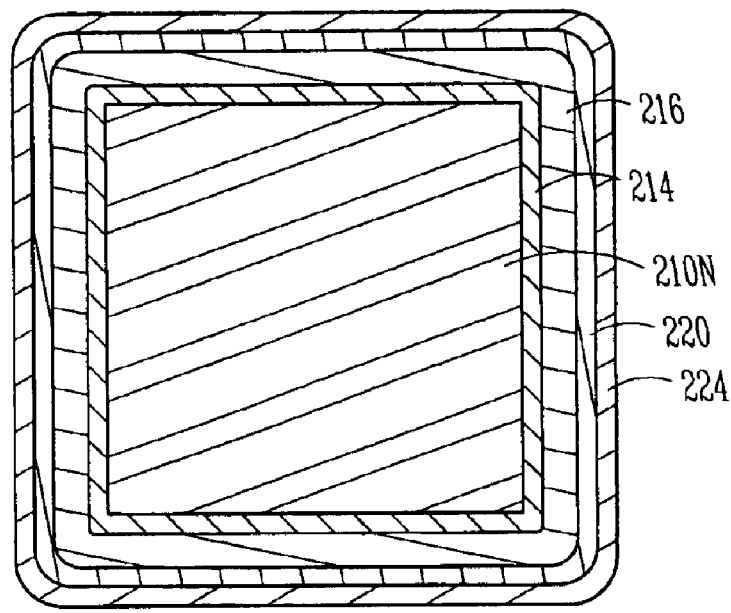

In FIG. 2B, the Aluminum layer 220 is then partially or totally converted to Aluminum oxide represented by layer 224. The Aluminum layer 220 is partially or totally converted to Aluminum oxide layer 224 by oxidation in an oxygen-containing ambient or by the well-known process of anodic oxidation in an oxygen plasma. As one of ordinary skill in the art will understand upon reading this disclosure, the number of other vacuum-deposited metals including chromium, titanium and zirconium, as stated above, can similarly be used in place of Aluminum according to the steps described herein.

As one of ordinary skill in the art will understand upon reading this disclosure, the metal layer 220 according to the teachings of the present invention further offers the advantage of being "self passivating." As know in the art, corrosion is an electrochemical process requiring at least several monolayers of water (serving as an electrolyte) in contact with metal. Water in solution in a polymer or other dielectric cannot serve as an electrolyte. However, there may be pockets underneath the metallization incompletely filled with polymer. Water pockets might collect in such places. If this occurs, corrosion can be accelerated where two dissimilar metals are in contact. This acceleration can be large when a reactive metal, e.g. high on the Electromotive Force Scale (EMF), contacts a more noble metal lying towards the bottom of the EMF scale. The difference in their EMF's generates an electrical potential causing dissolution of the reactive metal, aluminum, titanium, and chromium lie high on this scale while copper is near the bottom. In spite of the EMF differences, however, corrosion is not accelerated here because of another factor. Aluminum, titanium, and chromium can extract oxygen from water to form extremely effective passivating oxide barriers which protect these metals from corrosion, even in the presence of copper or gold, etc. Hence the origin of the phrase "self-passivating." Incidentally, niobium, hafnium, and vanadium and a few other metals exhibit self-passivation as well.

Deposition of Silicon on the Multilayer Metal Lines

The following descriptive methods are provided as various method embodiments for creating the environment to form a silicide layer 114 according to the teachings of the present invention. Polysilicon is generally deposited by pyrolysis of silane in the temperature range of 580–650° C. by using low-pressure chemical vapor deposition (LPCVD). Good thickness uniformity, high purity and high throughput can be achieved by this process. The structure and properties of the polysilicon films depend very much upon the deposition temperature, dopant type and concentration and subsequent thermal cycling. Films deposited below 580° C. are essentially amorphous. Above this temperature, one obtains polycrystalline films having preferred orientations: a {111} fiber axis with columnar grains is dominant near 625° C. and a {100} texture near 675° C. as disclosed in an article by T. I. Kamins, entitled "Structure/properties of LPCVD Si Films," *J. Electrochem. Soc.*, 127, 686 (March, 1980).

Deposition temperatures noted in the above LPCVD process, however, may be too high for applications in back-end processing which favor lower temperature processes. Accordingly, it is noted that the present invention can be performed at lower processing temperatures. To illustrate the same, reference is made to a silicon deposition process described by H. Keppner et al., in an article entitled "The Micromorph Cell: A New Way to High-Efficiency Low-Temperature Crystalline Thin-Film Cell Manufacturing," *MRS Symposium Proc.*, 452, p. 865–876 (1996). The same is incorporated herein by reference. In this article, Keppner et al. demonstrated successful deposition of microcrystalline silicon films at temperature as low as 220° C. for applications in solar cells. In one embodiment, the same process can be used according to the teachings of the present invention for forming a silicide layer 114 on the multilayer metal line structure 101. Utilizing a very high frequency glow-discharge technique (VHF-GD) at 70 MHZ in a parallel plate reactor, deposition rates up to 9.4 Å/s are attainable using mixtures of silane, hydrogen, and argon. Further, it has been shown that it is possible to grow polycrystalline silicon thin films by hot-wire CVD (HW CVD) at a relatively low temperature of 430° C. for photovoltaic applications by varying the hydrogen dilution of the silane feedstock gas, the gas pressure, and the wire temperature. The same is described in an article by J. K. Rath et al., entitled "Low-Temperature Deposition of Polycrystalline Silicon Thin Films by Hot-Wire CVD," *Solar Energy Materials and Solar Cells*, 48, p. 269–277 (1997) which is incorporated herein by reference. Other researchers have reported the growth of amorphous silicon films in the 30–120° C. range, and polycrystalline films at temperatures as low as 120° C. using an electron cyclotron resonance (ECR PECVD) system. The same is described in an article by S. Bae et al., entitled "Low-Temperature Deposition Pathways to Silicon Nitride, Amorphous Silicon, Polycrystalline Silicon and n-type Amorphous Silicon Films Using a High Density Plasma System," *IEEE Conf. Record—Abstract*, International Conference on Plasma Science, p. 315 (1997) which is incorporated herein by reference. It has also been shown that an ECR PECVD system can be used to deposit polycrystalline silicon thin films at room temperature and 500° C. The same is described in an article by Y. C. Jeon and S.-W. Lee, entitled "Low Temperature Fabrication of Polycrystalline Silicon Thin Films by ECR CVD," *Electrochem. Soc. Proceedings*, 94, no. 35, p. 103–104 (1995) which is incorporated herein by reference. The use of ECR CVD for the growth of polycrystalline silicon films with micro-meter-order grains at 250° C. has also been described in an article by K.-C. Wang et al., entitled "Very Low Temperature Deposition of Polycrystalline Silicon Films with Micrometer Order Grains on $SiO_2$," *MRS Symposium Proceedings*, 335, p. 582–586 (1995). The same is incorporated herein by reference. One of ordinary skill in the art will understand upon reading this disclosure, that any one or a number of the above referenced processes can be used to deposit a silicon layer on the number of metal lines from which to form the silicide layer 114 in the multilayer metal line structure according to the teachings of the present invention. These processes are disclosed in connection with the present invention as illustrative embodiments of the manner in which the present invention may be performed. The scope of the present invention, however, is not so limited. One of ordinary skill in the art will appreciate other suitable methods for forming a silicide layer 114 on the number of metal lines of the present invention as part of forming the novel multilevel wiring interconnects of the present invention.

Oxidation of Silicon

The following descriptive methods are provided as various method embodiments for forming the oxide layer or oxidized silicon layer for one structural embodiment of the present invention. In general, lightly-doped polySi oxidizes more rapidly in wet oxygen than single crystal silicon. Polysilicon heavily doped with phosphorous oxidizes more rapidly than undoped polySi. Thus, according to one embodiment of the present invention, forming the silicide layer 114 on the number of metal lines includes using pyrolysis of silane in a temperature range of between 300 to 500 degrees Celsius in the presence of a dopant source to achieve a lightly doped suicide layer 114 on the number of metal lines. Another embodiment includes using pyrolysis of silane in a temperature range of between 300 to 500 degrees Celsius in the presence of a dopant source to achieve a heavily doped silicide layer 114 on the number of metal lines. In one such embodiment, the heavily doped silicide layer 114 includes a silicide layer 114 which is heavily doped with phosphorous. The ratio of polySi consumed during oxidation to the thickness of oxide is approximately 1:1.56.

Again, it is noted that the present invention can be performed at low processing temperatures for applications where low thermal budget is critical. In such applications a low-temperature oxidation process such as magnetically excited plasma oxidation can be used. A low-temperature oxidation process is described in an article by Y. Okamoto et al., entitled "Magnetically Excited Plasma Oxynitridation of Si at Room Temperature," *Japan. J. Apply. Phys.*, 34, Part 2, no. 8A, pp. L995–957 (1995) and is incorporated herein by reference. Another combined plasma and rapid-thermal processing approach is described in an article by S. V. Hattangaday et al., entitled "Integrated Processing of Silicon Oxynitride Films by Combined Plasma and Rapid-thermal Processing," *J. Vac. Sci. Technol.*, A 14(6), p. 3017–23 (1996). This article is similarly incorporated herein by reference. It is further noted that a microwave plasma discharge at very low temperatures, e.g. at 200 to 250° C., has been used for the growth of thin silicon oxynitride films suitable for gate dielectric applications. The addition of $CHF_3$ as a source of fluorine enhanced the growth rate as described in an article by S. K. Ray et al., entitled "Fluorine-enhanced Nitridation of silicon at Low Temperatures in a Microwave Plasma," *J. Apply. Phys.*, 70, no. 3, p. 1874–6 (1991) which is incorporated herein by reference.

These processes for oxidation of silicon are disclosed in connection with the present invention as illustrative embodiments of the manner in which the present invention may be performed. The scope of the present invention, however, is not so limited. One of ordinary skill in the art will appreciate other suitable methods for oxidizing silicon to form the oxidized silicon layer 116 of the present invention as part of forming the novel multilevel wiring interconnects of the present invention.

Nitridation of Silicon

The following descriptive methods are provided as various method embodiments for forming the nitride layer or nitrided silicon layer for one structural embodiment of the present invention. It is much more difficult to form $Si_3N_4$ than $SiO_2$ as outlined in an article by S. Dushman and J. M. Lafferty, entitled "Scientific Foundations of Vacuum Technique, 2nd Edition," John Wiley and Sons (1962). Although solid silicon will not react noticeably with $N_2$ and/or $NH_3$ below approximately 1000° C., it will react with radicals and neutrals formed in plasmas containing these gases at much lower temperatures. This is described in an article by G. B. Kistiakowsky and G. G. Volpi, in *J. Chem. Phys.*, 27, 1141 (1957); and by H. F. Winters et al., in an article entitled "Influence of Surface Adsorption Characteristics on Reactively Sputtered Films Grown in the Biased and Unbiased Modes," *J. Appl. Phys.*, 43, No. 3, 794–799 (1958) which are incorporated herein by reference. Relatively thin layers (approximately 50 to 200 angstroms) of $Si_3N_4$ can be grown by reacting a $N_2$ or $NH_3$ plasma with silicon at temperatures below 200° C. as described in an article by T. Keyser et al., entitled "Low Temperature Plasma Nitridation Process and Application of Nitride Films Formed Thereby," and U.S. Pat. No. 4,762,728, issued Aug. 9, 1988 which are incorporated herein by reference.

Growth rates of $Si_3N_4$ are faster in $NH_3$ than in $N_2$ plasmas. For the purpose of the present invention, silicon can be converted to a $Si_3N_4$ passivation layer 116 by heating to temperatures in the 200 to 400° C. range in the presence of a $NH_3$ plasma. Control of the silicon nitride thickness can be accomplished by suitable manipulation of such variables as temperature, gas pressure and substrate bias. These processes for nitridation of silicon are disclosed in connection with the present invention as illustrative embodiments of the manner in which the present invention may be performed. The scope of the present invention, however, is not so limited. One of ordinary skill in the art will appreciate other suitable methods for the nitridation of silicon to form the nitrided silicon layer 116 of the present invention as part of forming the novel multilevel wiring interconnects of the present invention.

Deposition of a Metal Layer, e.g. Aluminum, on $SiO_2$ or $Si_3N_4$

Conformal coatings of a metal layer 220 on the $SiO_2$ or $Si_3N_4$ layer 216 of the present invention can be formed by LPCVD processes using a number of reactants and conditions. For example, conformal coatings of Aluminum can be formed by LPCVD as disclosed in an article by J. L. Vossen and W. Kern, entitled "Thin Film Processes. II," Academic Press, Inc. (1991) which is incorporated herein by reference. Also, LPCVD Aluminum films from trimethylamine complexes of alane as precursors have been investigated in detail and were found to yield mirror finish Aluminum films at reasonable rates at temperatures as low as 180° C. in a hot walled system. The same is described in an article by W. L. Gladlifter et al., entitled "Chemistry of Materials 1," 339 (1989) which is incorporated by reference. These processes are disclosed in connection with the present invention as illustrative embodiments of the manner in which the present invention may be performed. The scope of the present invention, however, is not so limited. One of ordinary skill in the art will appreciate other suitable methods for depositing a metal layer 220, including a metal layer selected from the group consisting of Aluminum, Chromium, Titanium, and Zirconium, on the $SiO_2$ or $Si_3N_4$ layer 216 of the present invention as part of forming the novel multilevel wiring interconnects of the present invention.

Oxidation of Metal Layers, e.g. Aluminum

The following descriptive methods are provided as various method embodiments for oxidizing metal layers for one structural embodiment of the present invention. In particular the descriptive method present here is that for oxidation of an Aluminum metal layer. However, one of ordinary skill in the art will understand, upon reading this disclosure, the manner in which similar oxidation techniques can be performed to oxidize a metal layer, including a metal layer selected from the group consisting of Aluminum, Chromium, Titanium, and Zirconium in order to create the oxidized metal layer 224 of the present invention as part of forming the novel multilevel wiring interconnects of the present invention. Thermal oxidation of aluminum proceeds slowly, forming approximately 25 angstroms of oxide in about 2 hours at 100° C. in one atmosphere of oxygen as described in an article by J. Grimblot and J. M. Eldridge, entitled "II. Oxidation of Aluminum Films," *J. Electrochem.*, 129, 2369 (1982). The same is incorporated herein by reference. The addition of large concentrations of water vapor to the reacting ambient increases the oxidation rate by perhaps 50% or so. The amorphous Aluminum Oxide ($Al_2O_3$) grown in either oxygen or steam is extremely dense, coherent and inert in most environments and thus has outstanding passivating properties. In cases like this, the passivation is bestowed by the quality of the surface oxide, not its thickness. As but one example of this principle, the atmospheric corrosion rate of permalloy ($Fe_{0.80}Ni_{0.20}$) can be increased by 100-fold by introducing defects and impurities into the approximately 20 angstrom, passivating layer of $Fe_2O_3$ that forms when this alloy is exposed to the ambient atmosphere. The same is disclosed in an article by J. M. Eldridge, entitled "New Approaches For Investigating Corrosion in Thin Film Devices," Electronic Packaging and Corrosion in Microelectronics, ASM (1987) and incorporated herein by reference. Thus, according to the teachings of the present invention, the oxidation of the metal layer is performed to avoid the introduction of defects and impurities such that the oxidized metal layer is essentially defect and impurity free.

Again, these processes are disclosed in connection with the present invention as illustrative embodiments of the manner in which the present invention may be performed. The scope of the present invention, however, is not so limited. One of ordinary skill in the art will appreciate other suitable methods for oxidizing a metal layer 220, including a metal layer 220 selected from the group consisting of Aluminum, Chromium, Titanium, and Zirconium, to produce one embodiment of the novel multilevel wiring interconnects of the present invention.

Figure 3:
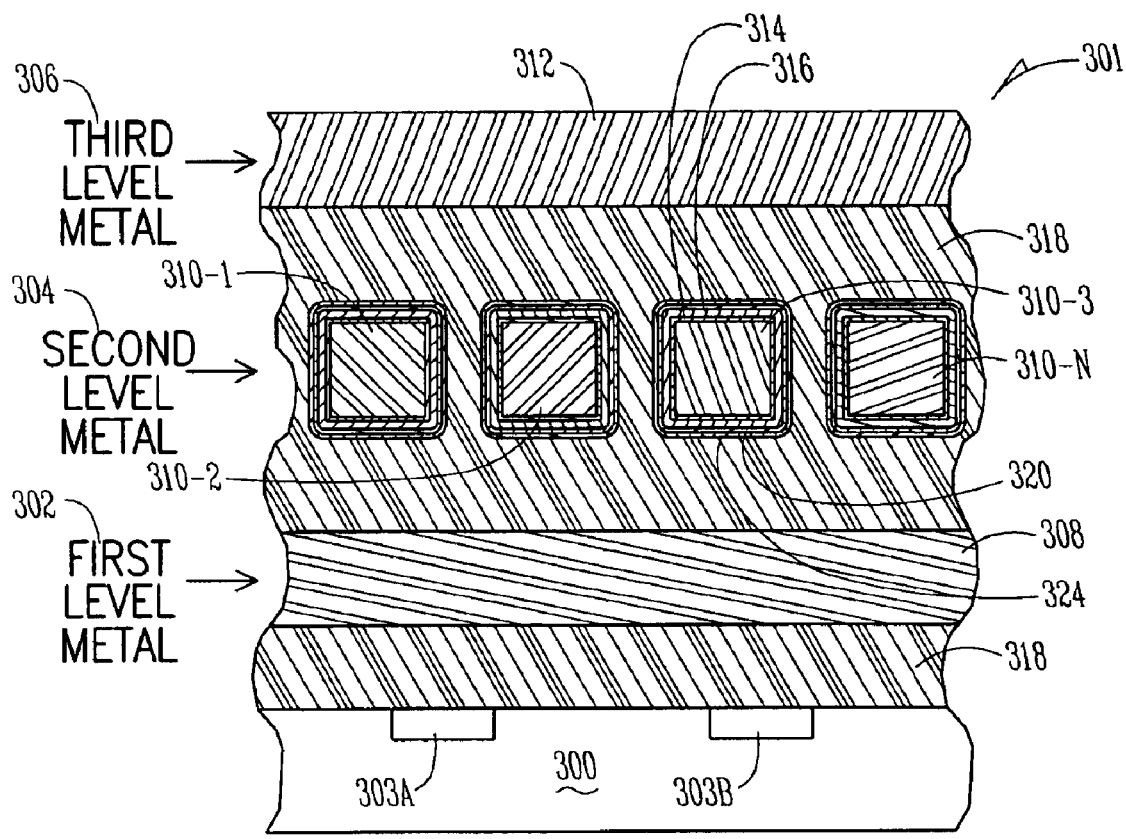
FIG. 3 illustrates a cross sectional view of an embodiment for a multilevel wiring interconnect in an integrated circuit assembly according to the teachings of the present invention.

FIG. 3 illustrates a cross sectional view of an embodiment for an integrated memory circuit including a multilevel wiring interconnect in an integrated circuit assembly according to the teachings of the present invention. As shown in FIG. 3, the multilevel wiring interconnect in an integrated circuit assembly includes a metal line air-bridge structure as disclosed in the commonly assigned U.S. Pat. No. 5,891,797, entitled "Method of Forming a Support Structure for Air Bridge Wiring of an Integrated Circuit," issued Apr. 6, 1999, the same is incorporated herein by reference. In FIG. 3, the cross sectional view of a multilevel metal line wiring structure 301 includes a number of metal line levels. The embodiment shown in FIG. 3 has a first metal line, second metal line, and third metal line levels, 302, 304 and 306 respectively, each containing a number of metal lines. In FIG. 3, a first level metal line 308 is represented as continuous metal line 308 running in a direction parallel to the plane of the drawing page in the first metal line level 302. As shown in FIG. 3, first metal line 308 is separated by an air gap in this portion the cross sectional view from a substrate 300. As one of ordinary skill in the art the substrate 300 can include one or more transistors, or semiconductor structures/devices which are represented by 303A and 303B in FIG. 3. One of ordinary skill in the art will further appreciate that a number of metal lines, such as metal line 108, connect to the one or more transistors, or semiconductor structures/devices 303A and 303B in a manner as disclosed in commonly assigned U.S. Pat. No. 5,891,797, entitled "Method of Forming a Support Structure for Air Bridge Wiring of an Integrated Circuit," issued Apr. 6, 1999. In one embodiment, the metal line 108 includes a first conductor bridge level. In FIG. 3, second metal line level 304 shows a number of second level metal lines 310-1, 310-2, . . . , 310-N which are represented running in a direction perpendicular to the plane of the drawing page. In FIG. 3, third metal line level 306 shows a third level metal line 312 which is represented as a continuous metal line 312 running in a direction parallel to the plane of the drawing page. One of ordinary skill in the art will understand, upon reading this disclosure, that the embodiment shown in FIG. 3 is only one cross hatched configuration for multilevel metal lines in a multilayer semiconductor circuit. Other metallization circuit designs are similarly included in the scope of the present invention.

One of ordinary skill in the art will understand from studying this disclosure together with commonly assigned U.S. Pat. No. 5,891,797, the manner in which the number of multilevel, or multilayer, metal lines can be interconnected between the multilevels to complete electrical connection. The same is not described in more detail in connection with the embodiment of FIG. 3 so as not to obscure the invention. According to one embodiment of the present invention, each of the metal lines selected from the group consisting of Aluminum, Copper, Silver, and Gold. As shown in FIG. 3, according to the teachings of the present invention, a thin silicide layer 314 is formed on the number of second level metal lines 310-1, 310-2, . . . , 310-N. A layer of silicon dioxide or silicon nitride, e.g. $SiO_2$ or $Si_3N_4$, 316 is formed on the silicide layer 314 on the number of second level metal lines 310-1, 310-2, . . . , 310-N.

As shown in FIG. 3, a subsequent metal layer 320 is formed on the $SiO_2$ or $Si_3N_4$ layer 316. According to the teachings of the present invention, the metal layer 320 includes a metal layer 320 selected from the group consisting of Aluminum, Chromium, Titanium, and Zirconium. In FIG. 3, the metal layer 320 includes a metal oxide layer 324.

Finally, as shown in FIG. 3, a low dielectric constant insulator 318 fills a number of interstices between the surfaces of the number of multilayer metal lines. Wide latitude can be used in selecting this low dielectric constant insulator 318, e.g. filling polymer, since the hermetic encapsulation is known to be a highly effective barrier that will prevent the transport of ions, molecules and moisture across it. In the absence of such a perfect hermetic barrier according to the teachings of the present invention, transport of various moieties could serve to induce a number of undesirable events including: localized copper corrosion and ultimate failure of the air-bridge; and, long-term polarization of the polymeric filler material 318 which could lead to the development of unacceptably large, localized fringing fields which would unpredictably interfere with the proper functioning of an underlying transistor array, number of semiconductor devices, e.g. 303A and 303B, and associated circuits in the substrate 300.

Figure 4:
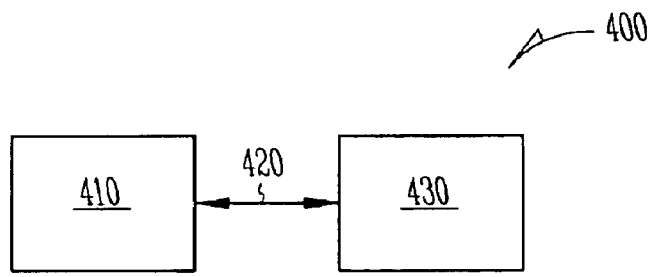
FIG. 4 illustrates a system having an integrated memory circuit and incorporating a multilevel wiring structure formed according to the teachings of the present invention.

FIG. 4 illustrates a system 400 having an integrated memory circuit 430 and incorporating a multilevel wiring structure formed according to the teachings of the present invention. As one of ordinary skill in the art will understand upon reading this disclosure, this system 400 includes a processor 410 and an integrated circuit, or integrated memory circuit 430 coupled to the processor 410. The processor 410 can be coupled to the integrated memory circuit 430 via any suitable bus 420, as the same are known and understood by one of ordinary skill in the art. In the embodiment, the processor 410 and integrated circuit 430 are located on a single wafer or die. Again, at least a portion of the integrated circuit 430 includes a multilevel wiring structure as disclosed in the various embodiments provided herein.

CONCLUSION

Thus, the present invention provides structures, systems and methods for multilevel wiring interconnects in an integrated circuit assembly which alleviate problems associated with integrated circuit size and performance. Structures, systems and methods are provide for multilevel wiring interconnects in an integrated circuit assembly which alleviate problems associated with integrated circuit size and performance. The structures, systems and methods of the present invention include a method for forming multilevel wiring interconnects in an integrated circuit assembly. The method includes forming a number of multilayer metal lines separated by a number of air gaps above a substrate. A silicide layer is formed on the number of multilayer metal lines. The silicide layer is oxidized. And, a low dielectric constant insulator is deposited to fill a number of interstices created by the number of air gaps between the number of multilayer metal lines. In one embodiment, forming the number of multilayer metal lines includes a first conductor bridge level. In one embodiment, forming a silicide layer on the number of multilayer metal lines includes using a pyrolysis of silane at a temperature of between 300 and 500 degrees Celsius. Also, in one embodiment, a metal layer is formed on the oxided silicide layer. The metal layer includes a metal layer selected from the group consisting of Aluminum, Chromium, Titanium, and Zirconium. In one embodiment, the metal layer includes a layer of Aluminum oxide.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

We claim:

1. A method for forming multilevel wiring interconnects in an integrated circuit assembly, comprising:
   forming a number of multilayer metal lines separated by a number of air gaps above a substrate;
   forming a silicide layer on the number of multilayer metal lines;
   oxidizing the silicide layer; and
   depositing a low dielectric constant insulator to fill a number of interstices between the number of multilayer metal lines.

2. The method of claim 1, wherein forming a number of multilayer metal lines includes a first conductor bridge level.

3. The method of claim 1, wherein forming a silicide layer on the number of multilayer metal lines includes using pyrolysis of a dilute silane ambient at a temperature of approximately 325 degrees Celsius.

4. The method of claim 3, wherein oxidizing the silicide layer includes using a plasma anodization process in an oxygen plasma in order to form a passivating layer for hermetic sealing of the number of multilayer metal lines.

5. The method of claim 1, wherein depositing a low dielectric constant insulator to fill a number of interstices between the number of multilayer metal lines includes depositing a low dielectric constant insulator in a single step.

6. A method for forming multilevel wiring interconnects in an integrated circuit assembly, comprising:
   forming a number of multilayer metal lines separated by a number of air gaps above a substrate;
   forming a silicide layer on the number of multilayer metal lines;
   nitriding the silicide layer; and
   depositing a low dielectric constant insulator to fill a number of interstices between the number of multilayer metal lines.

7. The method of claim 6, wherein forming a number of multilayer metal lines includes a first conductor bridge level.

8. The method of claim 6, wherein forming a silicide layer on the number of multilayer metal lines includes using a pyrolysis of silane in the presence of a dopant in order to form a lightly doped silicide layer.

9. The method of claim 8, wherein nitriding the silicide layer includes using a plasma anodization process in a nitrogen plasma in order to form a passivating layer for hermetic sealing of the number of multilayer metal lines.

10. The method of claim 6, wherein forming the number of multilayer metal lines includes forming a number of metal lines selected from the group consisting of Aluminum, Copper, Silver, and Gold.

11. The method of claim 6, wherein forming the number of multilayer metal lines includes forming the number of multilayer metal lines using electroless plating.

12. A method for forming multilayer wiring interconnects in an integrated circuit assembly, comprising:
    forming a number of multilayer Copper metal lines separated by a number of air gaps above a substrate;
    forming a silicide layer on the number of multilayer Copper metal lines;
    oxidizing the silicide layer; and
    depositing a low dielectric constant insulator to fill a number of interstices between the number of multilayer Copper metal lines.

13. The method of claim 12, wherein forming a silicide layer on the number of multilayer metal lines includes using a pyrolysis of silane at a temperature of between 300 and 500 degrees Celsius in the presence of a dopant in order to form a heavily doped silicide layer.

14. The method of claim 13, wherein oxidizing the silicide layer includes using a plasma anodization process in an oxygen plasma in order to form a passivating layer for hermetic sealing of the number of multilayer Copper metal lines and to add mechanical strength to the number of multilayer Copper metal lines.

15. The method of claim 12, wherein the method further includes depositing a layer of Aluminum on the number of multilayer Copper metal lines subsequent to oxidizing the silicide layer.

16. The method of claim 15, wherein depositing a layer of Aluminum includes depositing a layer of Aluminum using a low pressure chemical vapor deposition process (LPCVD) and forming Aluminum films from trimethylamine complexes of alane as precursors at temperatures of approximately 180 degrees Celsius in a hot walled system.

17. The method of claim 15, wherein the method further includes partially converting the Aluminum layer to Aluminum oxide by oxidation in an oxygen-containing ambient.

18. The method of claim 12, wherein the method further includes depositing a metal layer selected from the group consisting of Chromium, Titanium, and Zirconium on the number of multilayer Copper metal lines subsequent to oxidizing the silicide layer.

19. A method for forming multilayer wiring interconnects in an integrated circuit assembly, comprising:

forming a number of multilayer Copper metal lines separated by a number of air gaps above a substrate;

forming a silicide layer on the number of multilayer Copper metal lines;

oxidizing the silicide layer;

depositing a layer of Aluminum on the oxidized silicide layer; and depositing a low dielectric constant insulator to fill a number of interstices between the number of multilayer Copper metal lines.

20. The method of claim 19, wherein forming a silicide layer on the number of multilayer metal lines includes using a pyrolysis of silane at a temperature of between 300 and 500 degrees Celsius.

21. The method of claim 19, wherein oxidizing the silicide layer includes using a plasma anodization process in an oxygen plasma in order to form a passivating layer for hermetic sealing of the number of multilayer Copper metal lines and to add mechanical strength to the number of multilayer Copper metal lines.

22. The method of claim 19, wherein depositing a layer of Aluminum includes depositing a layer of Aluminum using a low pressure chemical vapor deposition process (LPCVD) and forming Aluminum films from trimethylamine complexes of alane as precursors at temperatures of approximately 180 degrees Celsius in a hot walled system.

23. The method of claim 19, wherein the method further includes converting the Aluminum layer to Aluminum oxide by oxidation in an oxygen-containing ambient.

24. The method of claim 23, wherein the method further includes thermally oxidizing the Aluminum layer at approximately 100 degrees Celsius in one atmosphere of oxygen to form a passivating layer of $Al_2O_3$ having a thickness of approximately 20 Angstroms (Å).

25. The method of claim 19, wherein oxidizing the silicide layer includes a low temperature oxidation process using a magnetically excited plasma oxidation process.

26. A method for forming multilayer wiring interconnects in an integrated circuit assembly, comprising:

forming a number of multilayer Copper metal lines separated by a number of air gaps above a substrate;

forming a silicide layer on the number of multilayer Copper metal lines;

nitriding the silicide layer;

depositing a layer of Aluminum on the oxidized silicide layer; and depositing a low dielectric constant insulator to fill a number of interstices between the number of multilayer Copper metal lines.

27. The method of claim 26, wherein forming a silicide layer on the number of multilayer metal lines includes using a pyrolysis of silane at a temperature of between 300 and 500 degrees Celsius.

28. The method of claim 26, wherein nitriding the silicide layer includes reacting an $N_2$ or $NH_3$ plasma with the silicide layer at temperatures below 200 degrees Celsius in order to form a thin layer of silicon nitride $Si_3N_4$ having a thickness between 50 and 200 Angstroms (Å).

29. The method of claim 26, wherein depositing a layer of Aluminum includes depositing a layer of Aluminum using a low pressure chemical vapor deposition process (LPCVD) and forming Aluminum films from trimethylamine complexes of alane as precursors at temperatures of approximately 180 degrees Celsius in a hot walled system.

30. The method of claim 26, wherein the method further includes converting the Aluminum layer to Aluminum oxide by oxidation in an oxygen-containing ambient.

31. The method of claim 30, wherein the method further includes thermally oxidizing the Aluminum layer at approximately 100 degrees Celsius in one atmosphere of oxygen to form a passivating layer of $Al_2O_3$ having a thickness of approximately 20 Angstroms (Å).

32. The method of claim 26, wherein forming a number of multilayer Copper metal lines above a substrate includes forming the number of multilayer Copper metal lines using electroless plating.

33. A method, comprising:

forming a metal line air-bridge structure from a number of multilayer metal lines that connect to a number of silicon devices in a substrate;

covering exposed surfaces of the air-bridge structure with a silicide layer;

hermetically sealing the underlying metal lines with an oxide layer on the silicide layer and the silicide layer; and forming a low dielectric constant insulator in the number of interstices.

34. The method of claim 33, wherein forming a metal line air-bridge structure includes forming the number of multilayer metal lines from a group consisting of Aluminum, Copper, Silver, and Gold.

35. The method of claim 33, wherein forming a metal line air-bridge structure includes forming a first conductor bridge level.

36. A method, comprising:

connecting a number of multilayer metal lines to a number of silicon devices in a substrate;

forming a lightly doped silicide layer on the number of multilayer metal lines;

hermetically sealing underlying metal lines with the silicide layer and an oxide layer on the silicide layer;

forming a low dielectric constant insulator in a number of interstices between the number of multilayer metal lines and the substrate; and wherein the silicide layer on the number of multilayer metal lines.

37. A method, comprising:

forming a metal line air-bridge structure, which has a number of top, bottom, and side exposed surfaces adjacent to a number of interstices in the air-bridge structure and connects to a number of silicon devices in a substrate;

covering the exposed surfaces of the air-bridge structure with a silicide layer;

hermetically sealing metal lines of the air-bridge structure underlying a nitride layer on the silicide layer; and providing a low dielectric constant insulator in the number of interstices.

38. The method of claim 37, wherein forming a metal line air-bridge structure includes forming a number of multilayer metal lines from a group consisting of Aluminum, Copper, Silver, and Gold.

39. A method, comprising:
connecting a number of multilayer metal lines to a number of silicon devices in a substrate;
forming a heavily doped silicide layer on the number of multilayer metal lines;
hermetically sealing metal lines using a nitride layer, which underlie the silicide layer, with nitride and silicide layers;
forming a low dielectric constant insulator in a number of interstices between the number of multilayer metal lines and the substrate.

40. A method, comprising:
forming a metal line air-bridge structure, which connects to a number of silicon devices in a substrate and has a number of top, bottom, and side exposed surfaces adjacent to a number of interstices in the air-bridge structure, with a number of multilayer Copper lines;
a silicide layer covering the exposed surfaces of the air-bridge structure with a silicide layer;
forming an oxide layer on the silicide layer overlying the metal lines so as to hermetically seal the underlying metal lines;
forming a metal layer on the oxide layer; and
forming a low dielectric constant insulator in the number of interstices.

41. The method of claim 40, wherein forming a metal line air-bridge structure includes forming a metal layer selected from the group consisting of Aluminum, Chromium, Titanium, and Zirconium.

42. The method of claim 41, wherein forming a metal layer includes forming a layer of Aluminum oxide.

43. A method, comprising:
forming one or more transistors in a substrate;
forming a metal line air-bridge structure, which connects to one or more of the transistors in the substrate and has a number of top, bottom, and side exposed surfaces adjacent to a number of interstices in the air-bridge structure, from a number of multilayer Copper lines;
covering the exposed surfaces of the air-bridge structure with a suicide layer;
hermetically sealing underlying metal lines with the silicide layer and an oxide layer on the silicide layer;
forming a layer of partially oxidized Aluminum on the oxide layer; and
forming a low dielectric constant insulator in the number of interstices.

44. The method claim 43, wherein forming a layer of partially oxidized Aluminum on the oxide layer includes preventing localized Copper corrosion in the number of multilayer Copper lines connecting to one or more of the transistors in the substrate.

45. The method of claim 43, wherein covering the exposed surfaces of the air-bridge structure with a silicide layer includes forming a polycrystalline layer at a temperature below 150 degrees Celsius using an electron cyclotron resonance plasma enhanced chemical vapor deposition process (ECR PECVD).

46. The method of claim 43, wherein forming a layer of partially oxidized Aluminum includes forming a layer of $Al_2O_3$ having a thickness of approximately 20 Angstroms (Å).

47. A method, comprising:
a substrate including one or more transistors;
forming a metal line air-bridge structure that connects to one or more of the transistors in the substrate and has a number of top, bottom, and side exposed surfaces adjacent to a number of interstices in the air-bridge structure from a number of multilayer Copper lines;
covering the exposed surfaces of the air-bridge structure with a silicide layer;
forming a nitride layer on the silicide layer so as to provide a hermetic seal of the underlying metal lines;
forming a layer of partially oxidized Aluminum on the nitride layer; and
forming a low dielectric constant, first insulator in the number of interstices.

48. The method of claim 47, wherein forming the nitride layer includes forming a thin layer of silicon nitride $Si_3N_4$ having a thickness between 50 and 200 Angstroms (Å) formed at temperatures below 200 degrees Celsius.

49. The method of claim 47, wherein forming a layer of partially oxidized Aluminum includes a passivating layer of $Al_2O_3$ having a thickness of approximately 20 Angstroms (Å) formed at approximately 100 degrees Celsius in one atmosphere of oxygen.

50. The method of claim 47, wherein forming a metal line air-bridge structure from a number of multilayer Copper lines includes electroless plating the multilayer Copper lines and forming a second insulator layer on the first insulator layer in the number of interstices.

51. The method of claim 50, wherein forming the first insulator layer includes:
forming a suicide layer on the number of multilayer Copper lines; and
forming an oxide layer on the silicide layer so as to hermetically seal the underlying metal lines.

52. The method of claim 50, wherein forming first insulator layer includes:
forming a suicide layer on the number of multilayer Copper lines; and
forming a nitride layer on the silicide layer such that the nitride and silicide layers provide a hermetic seal of the underlying metal lines.

53. The method of claim 50, wherein forming a metal line air-bridge structure from a number of multilayer Copper lines includes forming a metal layer on the first insulator layer.

54. The method of claim 53, wherein forming a metal layer includes forming a layer of $Al_2O_3$ having a thickness of approximately 20 Angstroms (Å).

55. The system of claim 53, wherein forming a metal layer includes forming a metal layer selected from the group consisting of Aluminum, Chromium, Titanium, and Zirconium.

56. A method, comprising:
providing one or more transistors in a substrate;
forming, from a number of multilayer Copper lines, a metal line air-bridge structure that connects to one or more of the transistors in the substrate and has a number of top, bottom, and side exposed surfaces adjacent to a number of interstices in the air-bridge structure;
covering the exposed surfaces of the air-bridge structure with a silicide layer;
hermetically sealing, with an oxide layer and the silicide layer, the underlying metal lines;
forming a metal layer on the oxide layer;
forming a low dielectric constant insulator in the number of interstices; and
coupling an integrated memory circuit including the metal line air-bridge structure to a processor.

57. The method of claim 56, wherein hermetically sealing includes preventing localized Copper corrosion in the number of multilayer Copper lines connecting to one or more of the transistors in the substrate.

58. The method of claim 56, wherein covering the exposed surfaces of the air-bridge structure with a silicide layer includes forming a polycrystalline layer at a temperature below 150 degrees Celsius using an electron cyclotron resonance plasma enhanced chemical vapor deposition process (ECR PECVD).

59. The method of claim 56, wherein forming the metal layer includes forming a layer of $Al_2O_3$ having a thickness of approximately 20 Angstroms (Å).

60. The method of claim 56, wherein forming the metal layer includes forming a metal layer selected from the group consisting of Aluminum, Chromium, Titanium, and Zirconium.

61. A method, comprising:
forming one or more transistors on a substrate;
forming, with a number of multilayer metal lines, a metal line air-bridge structure that connects to one or more of the transistors in the substrate and has a number of top, bottom, and side exposed surfaces adjacent to a number of interstices in the air-bridge structure;
covering the exposed surfaces of the air-bridge structure with a silicide layer;
providing an oxide layer on the silicide layer so as to provide a hermetic seal of the underlying metal lines with the oxide and suicide layers;
forming a layer of $Al_2O_3$ having a thickness of approximately 20 Angstroms (Å) on the oxide layer;
forming a low dielectric constant insulator in the number of interstices; and
coupling an integrated memory circuit including the metal line air-bridge structure to a processor.

62. The method of claim 61, wherein forming, with a number of multilayer metal lines, a metal line air-bridge structure includes forming a number of multilayer metal lines selected from the group consisting of Aluminum, Copper, Silver, and Gold.

63. The method of claim 61, wherein forming a low dielectric constant insulator includes forming a polyimide layer.

64. The method of claim 63, wherein forming the polyimide layer includes forming a foamed polyimide layer.

65. A method, comprising:
forming one or more transistors on a substrate;
connecting a number of multilayer metal lines to one or more of the transistors in the substrate;
forming a lightly doped silicide layer on the number of multilayer metal lines;
forming an oxide layer on the silicide layer so as to hermetically seal the underlying metal lines;
forming a layer of $Al_2O_3$ having a thickness of approximately 20 Angstroms (Å) on the oxide layer;
forming a low dielectric constant insulator in a number of interstices between the number of multilayer metal lines and the substrate; and
coupling an integrated memory circuit including the metal line air-bridge structure to a processor.

66. The method of claim 65, wherein connecting the number of multilayer metal lines connecting to one or more transistors in the substrate includes forming a first conductor bridge level.

67. A method, comprising:
forming, from a number of multilayer metal lines, a metal line air-bridge structure that connects to a number of silicon devices in a substrate and has a number of top, bottom, and side exposed surfaces adjacent to a number of interstices in the air-bridge structure;
covering the exposed surfaces of the air-bridge structure with a silicide layer;
hermetically sealing the underlying metal lines with the silicide layer and an oxide layer on the silicide layer; and
substantially filling the number of interstices with a low dielectric constant insulator.

68. A method, comprising:
forming, from a number of multilayer metal lines, a metal line air-bridge structure that connects to a number of silicon devices in a substrate and has a number of top, bottom, and side exposed surfaces adjacent to a number of interstices in the air-bridge structure;
covering the exposed surfaces of the air-bridge structure with a silicide layer;
forming an oxide layer converted from and located on the silicide layer so as to provide a hermetic seal of the underlying metal lines; and
forming a low dielectric constant insulator in the number of interstices.

69. A method, comprising:
forming, from a number of multilayer metal lines, a metal line air-bridge structure that connects to a number of silicon devices in a substrate and has a number of top, bottom, and side exposed surfaces adjacent to a number of interstices in the air-bridge structure;
providing a silicide layer covering the exposed surfaces of the air-bridge structure;
forming a nitride layer on the silicide layer wherein the nitride and silicide layers provide a hermetic seal of the underlying metal lines; and
substantially filling the number of interstices with a low dielectric constant insulator.

70. A method, comprising:
forming, from a number of multilayer metal lines, a metal line air-bridge structure that connects to a number of silicon devices in a substrate and has a number of top, bottom, and side exposed surfaces adjacent to a number of interstices in the air-bridge structure;
providing a silicide layer covering the exposed surfaces of the air-bridge structure;
forming a nitride layer converted from and located on the silicide layer wherein the nitride and silicide layers provide a hermetic seal of the underlying metal lines; and
forming a low dielectric constant insulator in the number of interstices.

71. A method, comprising:
forming, with a number of multilayer Copper lines, a metal line air-bridge structure that connects to a number of silicon devices in a substrate and has a number of top, bottom, and side exposed surfaces adjacent to a number of interstices in the air-bridge structure;
forming a silicide layer covering the exposed surfaces of the air-bridge structure;
forming an oxide layer on the silicide layer wherein the oxide and silicide layers provide a hermetic seal of the underlying metal lines;

forming a metal layer on the oxide layer; and
substantially filling the number of interstices with a low dielectric constant insulator.

72. A method, comprising:

forming, with a number of multilayer Copper lines, a metal line air-bridge structure that connects to a number of silicon devices in a substrate and has a number of top, bottom, and side exposed surfaces adjacent to a number of interstices in the air-bridge structure;

forming a silicide layer covering the exposed surfaces of the air-bridge structure;

forming an oxide layer converted from and located on the silicide layer wherein the oxide and silicide layers provide a hermetic seal of the underlying metal lines;

forming a metal layer on the oxide layer; and forming a low dielectric constant insulator in the number of interstices.

* * * * *

UNITED STATES PATENT AND TRADEMARK OFFICE
CERTIFICATE OF CORRECTION

PATENT NO. : 7,067,421 B2  
APPLICATION NO. : 10/721920  
DATED : June 27, 2006  
INVENTOR(S) : Ahn et al.

Page 1 of 1

It is certified that error appears in the above-identified patent and that said Letters Patent is hereby corrected as shown below:

In column 6, line 27, delete "suicide" and insert -- silicide --, therefor.

In column 9, line 13, delete "suicide" and insert -- silicide --, therefor.

In column 17, line 42, in Claim 43, delete "suicide" and insert -- silicide --, therefor.

In column 17, line 49, in Claim 44, after "method" insert -- of --.

In column 18, line 28, in Claim 51, delete "suicide" and insert -- silicide --, therefor.

In column 18, line 34, in Claim 52, delete "suicide" and insert -- silicide --, therefor.

In column 19, line 30, in Claim 61, delete "suicide" and insert -- silicide --, therefor.

Signed and Sealed this

Tenth Day of April, 2007

JON W. DUDAS  
*Director of the United States Patent and Trademark Office*